United States Patent  
Fonseca et al.

(10) Patent No.: US 11,244,873 B2  
(45) Date of Patent: Feb. 8, 2022

(54) SYSTEMS AND METHODS FOR MANUFACTURING MICROELECTRONIC DEVICES

(71) Applicant: Tokyo Electron Limited, Tokyo (JP)

(72) Inventors: Carlos A. Fonseca, Austin, TX (US); Nathan Ip, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 135 days.

(21) Appl. No.: 16/666,087

(22) Filed: Oct. 28, 2019

(65) Prior Publication Data

US 2020/0135592 A1 Apr. 30, 2020

Related U.S. Application Data

(60) Provisional application No. 62/753,153, filed on Oct. 31, 2018, provisional application No. 62/753,155, filed on Oct. 31, 2018.

(51) Int. Cl.
*H01L 21/66* (2006.01)  
*B81C 1/00* (2006.01)

(52) U.S. Cl.  
CPC .......... *H01L 22/12* (2013.01); *B81C 1/00261* (2013.01); *H01L 22/20* (2013.01)

(58) Field of Classification Search  
CPC .......... H01L 22/12; H01L 22/20; H01L 22/26  
See application file for complete search history.

(56) References Cited

U.S. PATENT DOCUMENTS

| 6,408,219 B2 | 6/2002 | Lamey, Jr. et al. |
| 2004/0093110 A1* | 5/2004 | Chong .................... H01L 22/20 700/121 |
| 2004/0267490 A1* | 12/2004 | Opsal .................. G03F 7/70625 702/127 |
| 2014/0114597 A1* | 4/2014 | Chen .................. G01N 21/9501 702/84 |
| 2014/0204194 A1 | 7/2014 | Otani et al. |
| 2015/0006097 A1* | 1/2015 | Gao ........................ H01L 22/12 702/81 |
| 2016/0275671 A1* | 9/2016 | Li ........................ H04N 5/2256 |
| 2017/0024510 A1 | 1/2017 | Shin et al. |
| 2017/0200264 A1 | 7/2017 | Park et al. |
| 2017/0221741 A1* | 8/2017 | Buhl ................. H01L 21/67276 |

(Continued)

FOREIGN PATENT DOCUMENTS

| EP | 1254401 B1 | 5/2004 |
| KR | 20170011554 A | 2/2017 |
| KR | 20170091536 A | 8/2017 |

*Primary Examiner* — Bac H Au  
(74) *Attorney, Agent, or Firm* — Slater Matsil, LLP

(57) ABSTRACT

In one embodiment, a method includes obtaining wafer measurements of a characteristic of a semiconductor wafer at each of a plurality of process steps during a semiconductor wafer fabrication process, where each of the wafer measurements is associated with a spatial location on the semiconductor wafer from which the measurement is obtained. The method may further include creating a process step fingerprint from the obtained wafer measurements for each process step. The method may further include correlating the process step fingerprint of one of the plurality of process steps to the process step fingerprint of another one of the plurality of process steps to produce a transfer function.

21 Claims, 13 Drawing Sheets

(56) References Cited

U.S. PATENT DOCUMENTS

2017/0242425 A1* 8/2017 Buhl .................... G03F 7/70625
2017/0358450 A1  12/2017 Ko et al.
2019/0137565 A1   5/2019 Fonseca et al.
2019/0139798 A1   5/2019 Fonseca et al.
2020/0233315 A1*  7/2020 Nije .................... G03F 7/70491

* cited by examiner

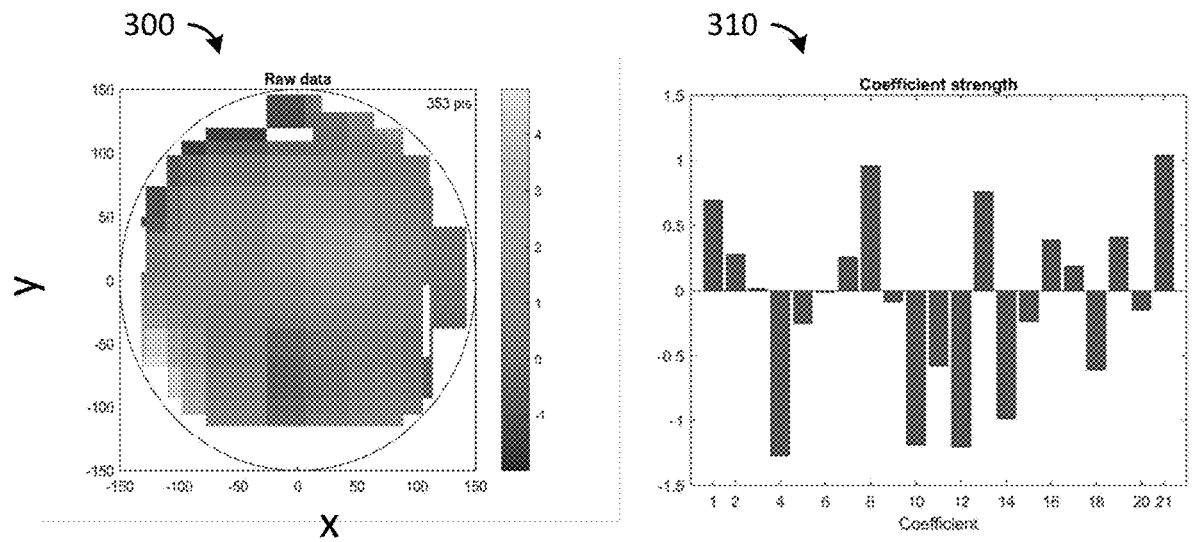
Figure 3A
Figure 3B
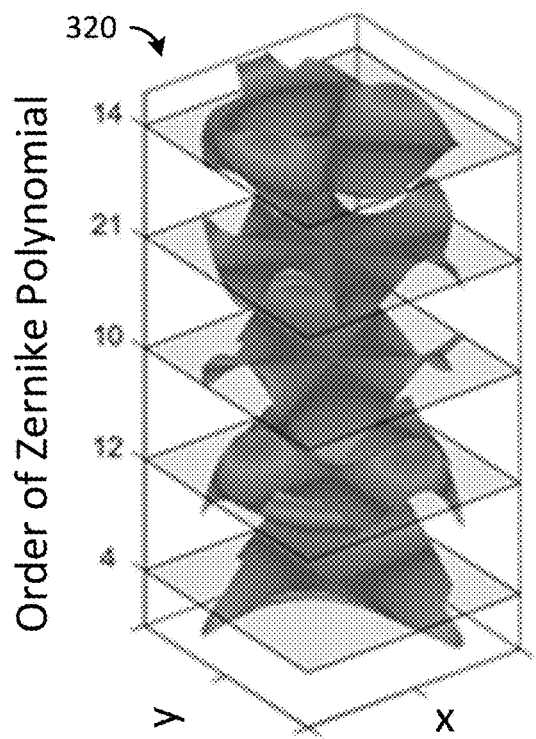
Figure 3C $$a_i = f_i(\mathrm{par}_1, \mathrm{par}_2, ...)$$

$$(EPE)_A = [((Var_B - Var_A) \times (MP)_A - Preg_A) - Lspec_A] - (OL)_{AB} + Pwalk_A$$

SYSTEMS AND METHODS FOR MANUFACTURING MICROELECTRONIC DEVICES

CROSS-REFERENCE TO RELATED APPLICATIONS

This application claims the benefit of U.S. Provisional Application No. 62/753,153, filed on Oct. 31, 2018 and U.S. Provisional Application No. 62/753,155 filed on Oct. 31, 2018, which applications are hereby incorporated herein by reference.

TECHNICAL FIELD

The present invention relates generally to a manufacturing system and method, and, in particular embodiments, to systems and methods for manufacturing microelectronic devices.

BACKGROUND

A microelectronic device is an individual electronic device and component or a collection thereof at a micrometer or smaller scale. An individual microelectronic device may include electronic components, such as transistors, capacitors, inductors, resistors, diodes, and the like, which may be connected to form combinations in accordance with a design. The connections may be formed by integrating a multi-layer interconnect network of vertical and lateral conductors isolated by insulators. The combinations may form electronic circuitry that collectively perform complex functions such as data storage and retrieval, computation, signal processing, and electronic image capture, or combinations thereof. An integrated circuit (IC), sometimes called a microchip, is an example of such a device. IC's are used in many electronic systems for industrial, military, and consumer applications, for example, equipment control, missile guidance systems, automotive electronics, televisions, digital cameras, and the like.

The miniature scale of a microelectronic device is especially advantageous in designing mobile electronic systems such as smart phones, laptop computers, and medical implants, e.g., pacemakers. Sophisticated techniques are used in the manufacture of microelectronic devices. One such technique involves the fabrication of semiconductor wafers. Typically, the microelectronic devices are produced as part of a stack of patterned layers of materials, e.g., semiconductors, insulators, and conductors to form a semiconductor wafer. With innovations in patterning technology, the minimum feature sizes have been periodically reduced to increase the packing density of components in a microelectronic device. With more components, the functionality of electronic circuits has been enhanced, thereby enabling a microelectronic device to perform more complex tasks.

As the complexity of microelectronic devices increases with increasing numbers of electronic components in each microelectronic device, innovations in semiconductor wafer fabrication manufacturing systems and manufacturing methods may be needed to provide low cost electrical-mechanically functional microelectronic devices produced by high yield semiconductor fabrication methods.

SUMMARY

In accordance with an embodiment of the present invention, a method comprises obtaining wafer measurements of a characteristic of a semiconductor wafer at each of a plurality of process steps during a semiconductor wafer fabrication process, where each of the wafer measurements is associated with a spatial location on the semiconductor wafer from which the measurement is obtained. The method may further include creating a process step fingerprint from the obtained wafer measurements for each process step. The method may further include correlating the process step fingerprint of one of the plurality of process steps to the process step fingerprint of another one of the plurality of process steps to produce a transfer function.

In accordance with an embodiment of the present invention, a method comprises having a fabrication process for manufacturing a plurality of semiconductor wafers. The fabrication process comprises a plurality of process steps, where each of the plurality of process steps being associated with a set of process parameters. The method further includes performing a first process step from the plurality of process steps on a first semiconductor wafer, where the first process step has an associated first process parameter, the first process parameter having a first process parameter value when performing the first process step on the first semiconductor wafer. The method further includes obtaining first measurements from the first semiconductor wafer, where the first measurements comprise first characteristic values of a first characteristic at a first plurality of spatial locations on the first semiconductor wafer. The method further includes generating a first process step fingerprint for the first process step from the first measurements. The method may further include performing the first process step and a second process step from the plurality of process steps on a second semiconductor wafer, where the second process step has an associated second process parameter. The second process parameter has a second process parameter value when performing the second process step on the second semiconductor wafer. The method may further include obtaining second measurements from the second semiconductor wafer, where the second measurements comprising second characteristic values of a second characteristic at a second plurality of spatial locations on the second semiconductor wafer. The method may further include generating a second process step fingerprint for the second process step from the second measurements. The method may further include correlating the first process step fingerprint to the second process step fingerprint to produce a transfer function between the first process step and the second process step.

In accordance with an embodiment of the present invention, a non-transitory computer-readable storage medium comprises instructions that when executed cause a processor of a computing device to perform operations in coordination with a semiconductor wafer fabrication process, the semiconductor wafer fabrication process comprising a plurality of process steps, each of the plurality of process steps being associated with a set of process parameters. The operations comprise performing a first process step from the plurality of process steps on a first semiconductor wafer, where the first process step has an associated first process parameter, the first process parameter having a first process parameter value when performing the first process step on the first semiconductor wafer. The operations further include obtaining first measurements from the first semiconductor wafer, where the first measurements comprise first characteristic values of a first characteristic at a first plurality of spatial locations on the first semiconductor wafer. The operations further include generating a first process step fingerprint for the first process step from the first measurements. The operations may further include performing the first process step and a second process step from the plurality of process steps on a second semiconductor wafer, where the second process step has an associated second process parameter. The second process parameter has a second process parameter value when performing the second process step on the second semiconductor wafer. The operations may further include obtaining second measurements from the second semiconductor wafer, where the second measurements comprising second characteristic values of a second characteristic at a second plurality of spatial locations on the second semiconductor wafer. The operations may further include generating a second process step fingerprint for the second process step from the second measurements. The operations may further include correlating the first process step fingerprint to the second process step fingerprint to produce a transfer function between the first process step and the second process step.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3C illustrate a portion of an example method wherein a measurement fingerprint of an in-line measurement type is generated, in accordance with one embodiment;

DETAILED DESCRIPTION OF ILLUSTRATIVE EMBODIMENTS

Figure 1A:
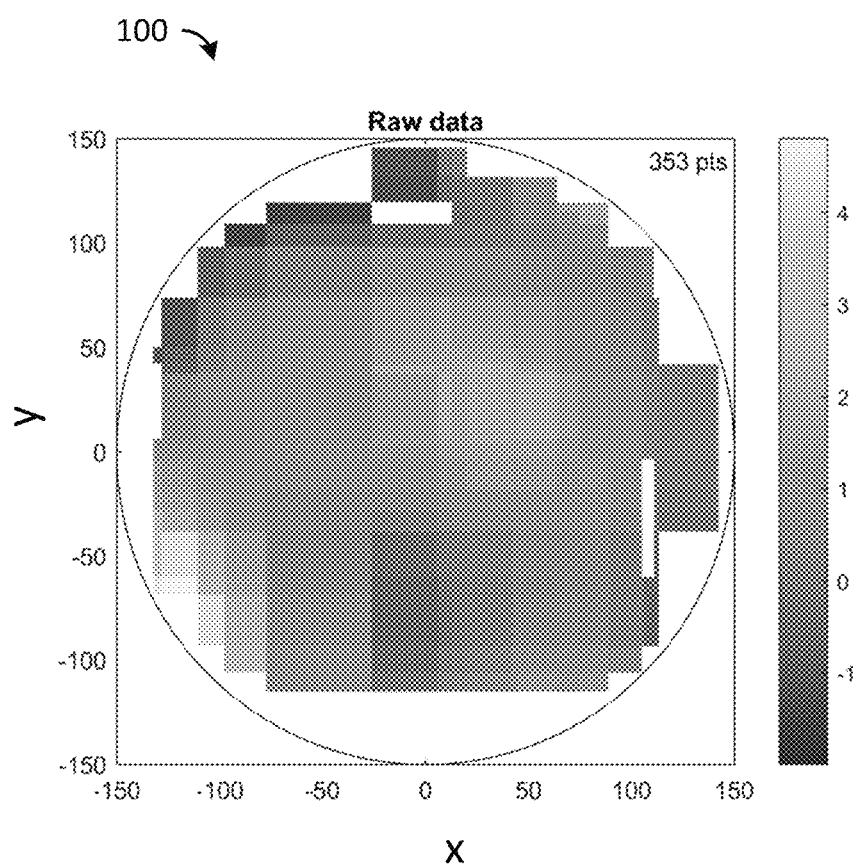
FIG. 1A illustrates an example of a measurable outcome of a process step of a wafer fabrication manufacturing system, in accordance with one embodiment.

Existing approaches for the fabrication of semiconductor wafers use metrics that are a single value that is applied to or assumed to apply across the entire wafer. The conventional applications of these metrics are based on measurements of an individual or sample wafer.

These conventional approaches discard or ignore information related to or associated with each measurement. For example, such information may include spatial information or correlations between measurements. Such information is potentially valuable. Edge Placement Error (EPE) is an example of a combination of different measurements to form a metric that can be correlated to yield.

The technology described herein, in various embodiments, preserves spatial information by generating a process model built using a lot more available information. In addition, the technology described herein, in various embodiments, can be dynamically applied to semiconductor manufacturing and is amenable to be automated using a feedback control loop.

Embodiments of semiconductor wafer fabrication manufacturing systems and manufacturing methods described herein may improve manufacturing yield and manufacturing cost of microelectronic devices produced by the technique of semiconductor wafer fabrication. Semiconductor wafer fabrication may be described as execution of a sequence of process modules; each process module comprising a series of unit process steps. Example unit process steps include surface preparation, ion implantation, thermal steps (e.g., rapid thermal oxidation (RTO), rapid thermal anneal (RTA), and laser anneal), photolithography steps (e.g., resist coat, exposure, develop, and strip), electroplating, plasma deposition, plasma etch, wet etch, chemical mechanical polish (CMP), and the like, performed in accordance with a sequential process flow to fabricate a layer, for example, an active layer, dummy gate layer, source-drain layer, metal gate layer, contact layer, and the like. The respective process modules may be referred to as the active module, dummy gate module, and so on. The manufacturing yield of a semiconductor wafer production line may be considered to be the fraction of the completed microelectronic devices having electrically testable metrics (e.g., transistor leakage, resistor resistance, circuit functionality, etc.) that conform to a set of specifications.

The manufacturing systems described in this disclosure adopt methods wherein fingerprints (FP's) of metrics that correlate to manufacturing yield are generated from one or more in-line measurements performed at multiple spatial locations of one or more semiconductor wafers. For each layer, FP's of metrics appropriate for the layer are generated, as described in further detail below. For example, an FP for edge placement error (EPE) may be generated for the dummy gate layer. In the embodiments in this disclosure, each FP is a mathematical model of the respective metric that retains the spatial information of the measurements. In some embodiments, the mathematical model is a mathematical function of the spatial coordinates of the locations on a wafer from where the in-line measurements have been obtained. The mathematical function may be expanded in a finite series of mathematical functions, referred to as basis functions. The FP may then be represented by a coefficient vector comprising an ordered set of the coefficients of respective terms of the series expansion of the model function. As described in further detail below, the FP of a layer metric may be a composite of a hierarchy of FP's. For example, the active layer EPE FP may be a composite mathematical model including contributions from several FP's such as height of mandrel (used for sidewall image transfer (SIT)), pitch-walk (for multiple patterning techniques), overlay (e.g., alignment errors between an active mask and an alignment mask), and the like. These FP's (e.g., mandrel height, pitch-walk, and overlay) may, in turn, be derived from one or more FP's of, e.g., in-line measurements such as deposited film thickness of the mandrel, pitch of multiple patterns of a sidewall hard mask, dimensions of features in an overlay pattern, and the like.

The in-line measurements are designed to identify outcomes of the preceding process steps that may eventually impact the manufacturing yield at the end of the wafer fabrication production line. As known to persons skilled in the art, an outcome of processing steps may be modulated by a set of adjustable process parameters. The process parameters are generally equipment settings selected to execute one or more process steps. For example, a dummy gate resist EPE measurement after a resist develop process step in the dummy gate process module may be modulated by a wafer spin speed at a resist coat step, and an exposure time and a position of a focal plane during a photoresist exposure step. Accordingly, each coefficient of the FP for the dummy gate resist EPE may be modulated by the adjustable process parameters: in this example, the spin speed, exposure, and focus. The response of an FP coefficient (e.g., the dummy gate resist EPE FP) to a set of process parameters (e.g., spin speed, exposure, and focus) may be modeled as a mathematical function of a set of independent variables, wherein each variable is a numerical representation of a process parameter appropriately normalized to the units for EPE (e.g., nanometer). These mathematical descriptions collectively form a process model for the dummy gate resist EPE.

In this example, because the dummy gate resist EPE is a direct measurement, its FP is one of the bottom level FP's in the hierarchy of FP's. It may be further noted, that in this embodiment, the process model may retain the spatial information in the dummy gate resist EPE measurements by accurately modeling the dummy gate resist EPE FP. In general, there may be more than one measurement type, (e.g., EPE, line edge roughness (LER), overlay, critical dimension (CD), linewidth roughness (LWR), and the like). A bottom level FP having its respective process model may be generated for each measurement type of the process step. Combinations and calculations (e.g., the difference between two measurements) with the in-line measurement FP's for measurements obtained at the present or previous process steps may be done to create a next higher level of FP's for that process step.

The measurable outcomes of a process step often depend on the state of the incoming wafer. For example, EPE of the dummy gate resist pattern may be affected by the height of fins formed protruding above shallow trench isolation (STI) oxide at the active level in a process flow comprising fabrication of a fin-shaped transistor structure called Fin-FET. The fin-heights measured in the active process module may be accurately reproduced by an active fin-height FP. The state of the incoming wafer is generally determined both by the previous process modules and by the completed process steps of the current process module. Accordingly, the top level FP's of the previous process modules and the highest level FP's of the completed steps in the present process module may correlate to measurements at a subsequent process step; hence correlate to the FP's generated therefrom. In this example, the active fin-height FP may influence one or more FP's of in-line measurements at the dummy gate layer, such as the dummy gate resist FP's for EPE, CD, LER, LWR, and overlay. Such correlations between pairs of FP's (e.g., between the active fin-height FP and the dummy gate resist EPE FP) are characterized for the process flow and fed forward from the previous process steps as transfer functions suitable for use in generating the measurement (bottom level) FP's of the subsequent process step. In one embodiment, a transfer function may be implemented as a transformation matrix that maps a coefficient vector of an earlier FP (e.g., the active fin-height FP) to a component vector that can be incorporated in the coefficient vector of a bottom level FP of the subsequent process step (e.g., the dummy gate resist EPE FP). In general, a transfer function may be implemented using any numerical model such as, a transformation matrix, a set of differential equations, a look-up table, a set of statistical correlation functions, or an iterative algorithm, or the like that may be used to include the impact of a metric computed from wafer characteristics of previous process steps on the FP of a metric derived from measurements done at a subsequent process step. Furthermore, although we have formulated the influence of previous processing on the wafer characteristics at the immediate process step as a transfer function mapping one or more FP models at the previous process step on to at least a portion of a measurement FP at the immediate process step, other formulations are conceivable. For example, a transfer function may be formulated to describe a mapping of the process parameters at the previous step on to at least a portion of a FP model of a metric derived from a combination/calculation of one or more in-line wafer fabrication metrology data at the immediate process step. Once the impact of the previous processing is incorporated into the bottom level FP, the correlations with previous process steps are naturally included in any higher level FP formed subsequently using the bottom level FP.

After generating the FP's for the process steps of a process module, combinations and calculations may be applied to generate the next higher level of FP's which could be the FP's of the process module or layer, as described further below. For example, several FP's of process steps in the dummy gate process module such as the dummy gate resist CD FP, the dummy gate etch bias FP, overlay, and others may be combined to generate a dummy gate CD FP for the dummy gate layer.

Embodiments of the method of using FP's and generating process models for the FP coefficients which retain and reproduce spatial coordinates of the raw measurement data is advantageous for monitoring and controlling a semiconductor wafer fabrication production line. A statistical process control (SPC) strategy employing a monitoring of the FP coefficient vectors that provide spatial information facilitates identifying the source of a process excursion that may be degrading the yield of a wafer fabrication production line. For example, if an increased radial dependence is observed from the abnormality in the coefficients in the FP of a metric that may be affected by several process parameters of which one represents a radial gas flow then that may suggest an abnormal gas flow. The process model for the FP coefficient showing an abnormal value could be utilized in conjunction with the spatial information to simulate the abnormality in order to help quickly identify the equipment and equipment setting where intervention may succeed in recovering the manufacturing yield.

Generating FP coefficient vectors wherein correlations with previous process steps are incorporated using transfer functions provides several unique advantages to a wafer fabrication manufacturing system. The transfer function method effectively partitions the coefficient vector of the measurement FP's into two component vectors: one that correlates with previous processing and another, referred to as the immediate step vector that correlates with the immediately completed process step. The component that correlates with fingerprints of earlier steps is predictable from the processing history and is referred to as the transferred vector or transferred component of the measurement FP. Such a decomposition of the FP coefficient vector may be used to partition a deviation observed at a given process step into a portion due to the incoming wafer state and a portion due to the immediate process step. Furthermore, the predictability may be used to feed forward corrective actions or make early decisions on terminating further processing.

The transfer function method enhances the accuracy of the process model for the entire fabrication process flow by retaining the impact of all the earlier process steps in the FP for a metric in a subsequent process step. This capability may be advantageously used in computer aided analyses to adjust process parameters to improve the yield of the production line, as described in further detail below. The spatial information along with the process models may help in more targeted adjustments to optimize equipment settings to increase manufacturing yield. Furthermore, the analyses may identify specific equipment worth further investment because of its high impact on manufacturing yield, and may also identify specific equipment where a cheaper alternative may be used with negligible impact on the manufacturing yield.

The manufacturing systems and methods outlined above are illustrated in further detail below with reference to FIGS. 1 through 8.

The wafer map in FIG. 1A illustrates an example of a directly measurable outcome 100 of a process step (e.g., an EPE measurement of a resist patterning step) of a wafer fabrication manufacturing system, where the outcome is a collection of the same type of measurement repeated at multiple die locations on the wafer. A dataset comprising data values associated with a spatial location (e.g., two-dimensional (2D) rectangular coordinates, x and y, or polar coordinates r and θ) on one sample wafer or a collection of such wafers may be displayed as a wafer map. In a wafer map each data point is given an area in a two-dimensional image of a wafer, in accordance with its associated spatial coordinates. In the wafer maps in this document, such as the image in FIG. 1A, the data points are depicted as tessellated rectangles having values indicated by a grayscale.

Figure 1B:
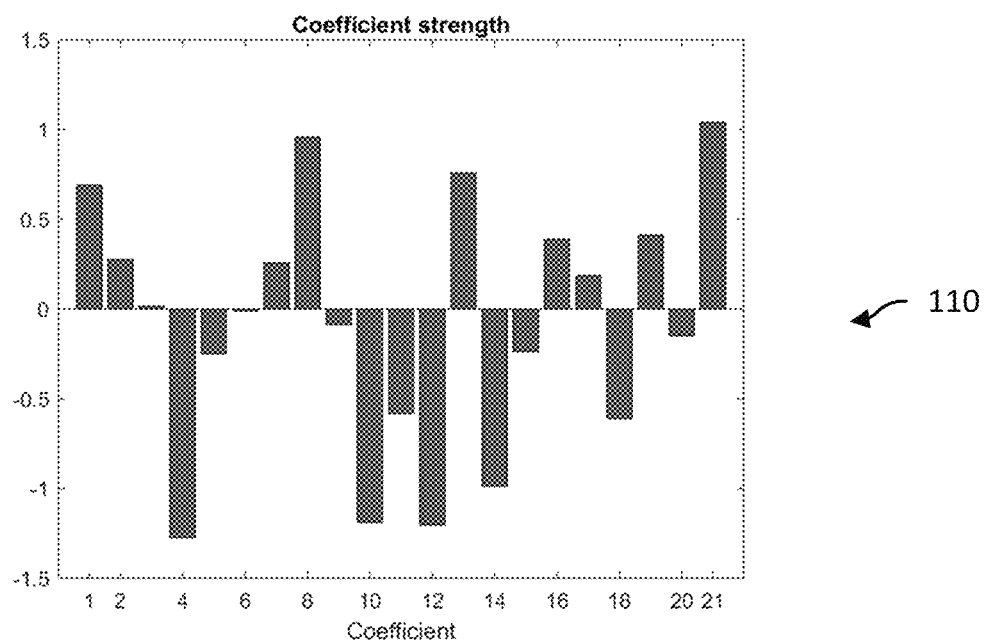
FIGS. 1B and 1C illustrate an example fingerprint of the measurable outcome illustrated in FIG. 1A.
Figure 1C:
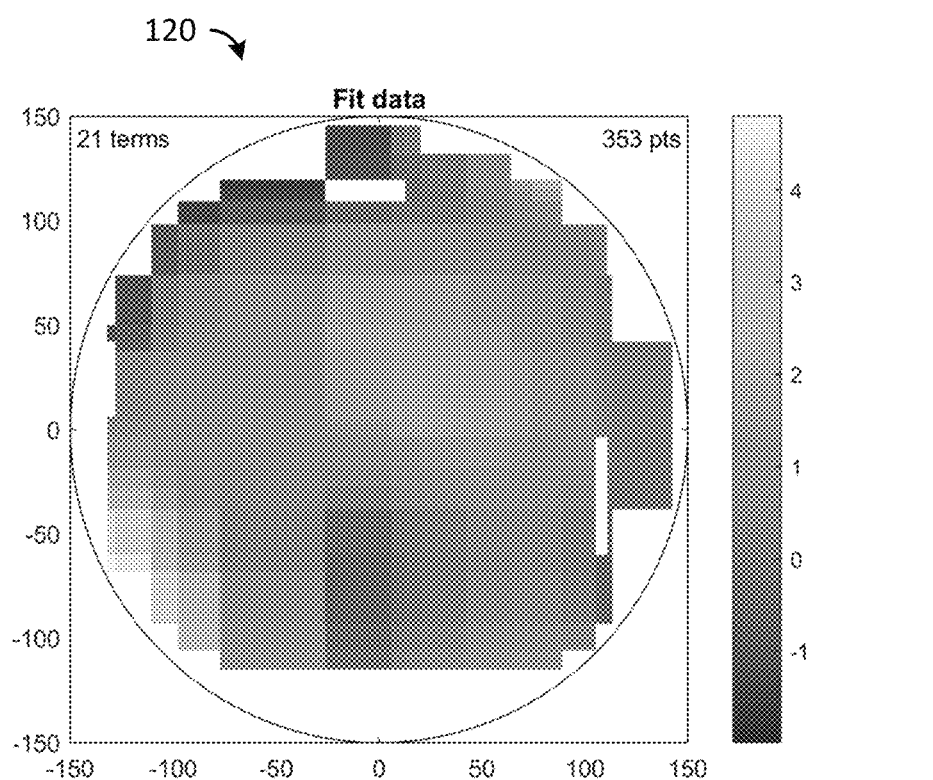

The raw data (e.g., the directly measured EPE values and their associated coordinates) may be processed to create a fingerprint (FP) model. In particular, an analysis, such as a regression analysis, may be performed to select and adjust the parameters of a function for a best fit to the raw data values, for example, the least error between the measured values of EPE and the values computed by an FP model using the optimized parameters. The analysis includes selecting an appropriate mathematical function of the 2D spatial coordinates that may reproduce the spatial patterns in the raw data with a manageable finite number of adjustable parameters. For example, measurements which may be sensitive to a process step where, for example, liquid photoresist is introduced in the center region of a spinning wafer and distributed across the wafer surface by radial centrifugal forces, the model function may be selected to be a function of the polar coordinates r and θ, expressed mathematically as a finite series of Zernike polynomials (or other functions such as Fourier series and Bessel functions). Each polynomial is weighted by its respective numerical coefficient. These coefficients are the fitting parameters of the model whose values may be optimized during the analysis to obtain the best fit to the raw data. An ordered set of coefficients is referred to as a coefficient vector, where each coefficient is one component of the coefficient vector. Collectively, the components (arranged in the same order as the order of the Zernike polynomials) constitute an FP model of the raw data. The coefficient vector illustrated in FIG. 1B is an example of an FP model of the raw data depicted by the wafer map in FIG. 1A. The model function used for the FP model in FIG. 1B comprises a series of the first 21 Zernike polynomials weighted by 21 coefficients plotted in order in FIG. 1B. The wafer map 120 in FIG. 1C depicts the modeled values, as calculated using the optimized FP model illustrated in FIG. 1B. As may be observed from a comparison of the two wafer maps (FIGS. 1A and 1C), the FP model in FIG. 1B is able to reproduce the raw data fairly accurately.

In some instances, the initial FP model (e.g., the 21-dimensional coefficient vector in FIG. 1B) may be simplified further by extending the analysis to include identifying the dominant model parameters. If the coefficient vector has few principal components (e.g., five coefficients that significantly affect the calculated data values) then the initial FP model comprising, for example, 21 coefficients, may be approximated by the few identified principal coefficients, for example, five principal coefficients. In some embodiments, the low-dimensional (e.g., five-dimensional) coefficient vector may replace the initial high-dimensional (e.g., 21-dimensional) FP model for further processing and computation (the rest of the coefficients being ignored).

Figure 2:
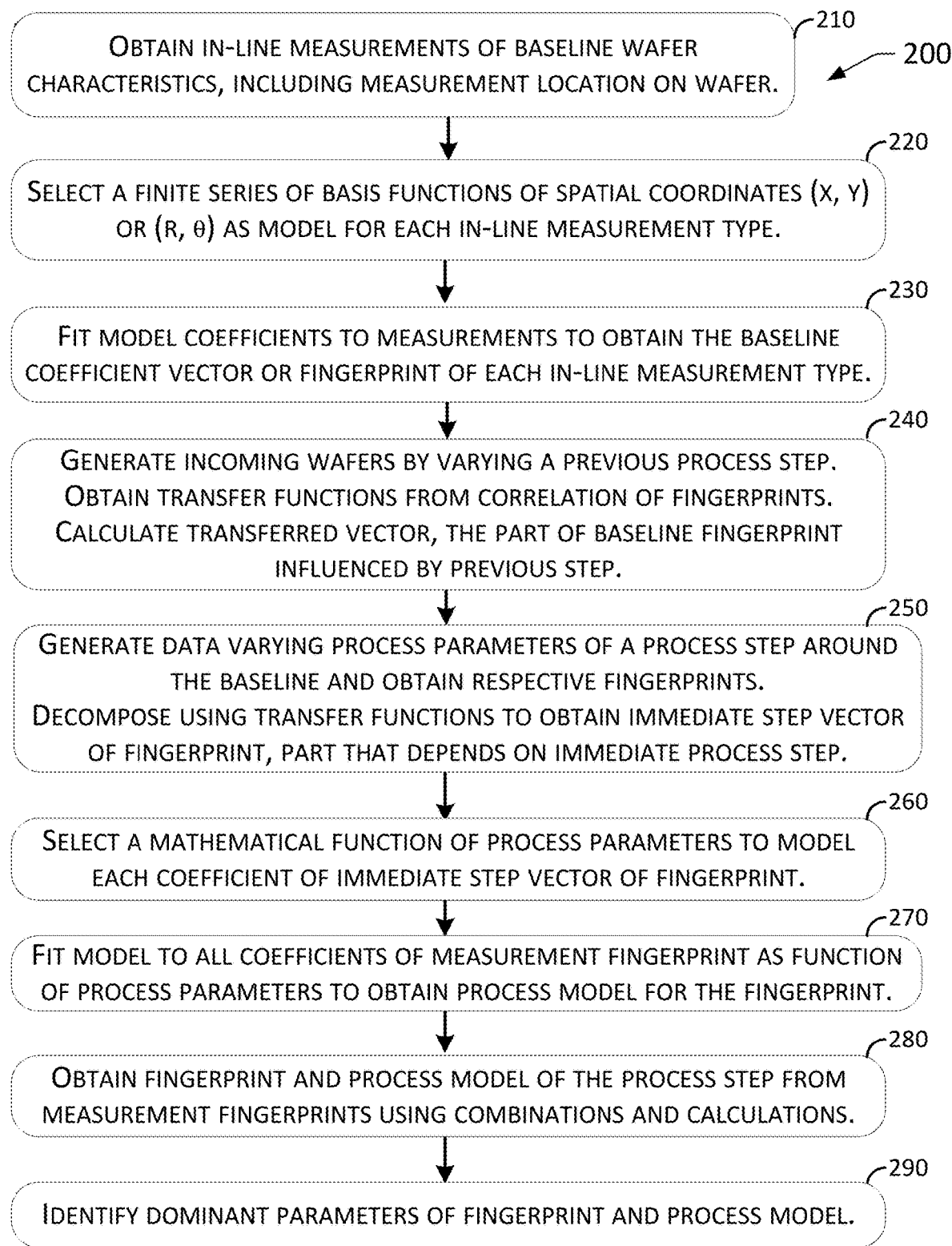
FIG. 2 is a flowchart illustrating a portion of an example method in a wafer fabrication manufacturing system used for generating fingerprint models, transfer functions, and process model of a process step from in-line measurements of wafer fabrication metrology, in accordance with one embodiment.

FIG. 2 is a flowchart that illustrates an execution flow for one process step in an example system 200 that implements the techniques described above. The example system 200 is performed in cooperation with fabrication of semiconductor wafers. In some instances, the cooperation may include the example system 200 being an integral part of the fabrication itself. As described in detail below, processing steps in addition to the baseline (the plan-of-record) wafer fabrication process may be performed to obtain measurements to extract accurate model parameters with high confidence.

The example process 200 is explained herein as being performed by a system 200 for simplicity sake and not any limitation. FIGS. 3 and 4 accompany the flowchart of FIG. 2 to help explain some of the steps in system 200. FIG. 3 is used to illustrate generation of a measurement FP as a function of the coordinates of measurement locations on the wafer. FIG. 4 is used to explain the method using which system 200 generates a process model to compute the response of coefficients of the fingerprint models to changes in process parameters.

As indicated by block 210 in the flowchart of system 200 in FIG. 2, the first step in the stepwise description of the method used in system 200 to create a predictive mathematical model of outcomes of a process step, the model comprising FP's, transfer functions, and process models, is to obtain in-line measurements of one or more characteristics (e.g., resist CD of lines in a pattern of dense lines) of semiconductor wafers processed in accordance with a baseline fabrication process flow. Each obtained measurement is associated with a wafer spatial location from which the measurement is obtained and may be depicted graphically by a wafer map, similar to that described with reference to FIG. 1A. Graph 300 of FIG. 3A is a wafer map of the raw data of measurements, for example, CD measurements gathered from a collection of baseline processed wafers, at the same set of locations on each wafer.

More generally, the actions of block 210 may be described as gathering in-line fabrication metrology data of the semiconductor wafers with spatial information of that gathered data. This in-line fabrication metrology data is produced from in-line measurements taken of, about, on, in, and for the wafer of a characteristic that results from some process step of the baseline fabrication process flow. The measurement may be taken during the process step or after completion. That is, the in-line fabrication metrology data is a measurement of a characteristic of the wafer formed in the process step of the baseline semiconductor fabrication process flow.

In-line fabrication metrology data at a process step may be derived from measurements about a film of material processed in the process step (e.g., a deposited film thickness), patterns in the processed film (e.g., resist linewidth at resist develop step), devices completed by the processing at the process step (e.g., by metal CMP at an interconnect level), an inchoate device (e.g., an alignment mark) exposed by etching a material, and the like. Herein, the process step may be processing a material film that is the focus of the fabrication at that moment. Often, the film is the top or uppermost film. For example, the film is the one that is or was just deposited, cleaned, or etched.

In some instances, for example, the in-line fabrication metrology data may be derived from measurements about a film immediately adjacent the film that is the current focus of the fabrication, patterns in that adjacent layer, devices completed by the adjacent layer, an inchoate device exposed by the adjacent layer, and the like. Often, that immediate adjacent layer is the layer just below the uppermost film.

In still other instances, for example, the in-line fabrication metrology data may be derived from measurements about multiple adjacent layers of the wafer or of the wafer itself. For example, the multiple adjacent layers of the wafer may include electrically and/or mechanically interacting microelectronic devices therein.

Typically, the in-line fabrication metrology data includes measurements from (calculations based on measurements from) multiple semiconductor wafers using a common stack of patterns of materials during the semiconductor fabrication. Examples of different types of in-line fabrication metrology data include measuring and/or calculating data such as measuring and/or calculating in-line fabrication metrology data selected from a group consisting of EPE, grid CD measurements, block LWR measurements, grid LWR measurements, block CD measurements, edge profile, selectivity for selective deposition and/or selective etch; electrical properties of the formed microelectronic devices; contact hole CD; contact hole edge roughness (CER) and ellipticity; tip-to-tip distances for short and long lines and trenches; overlay error measurements between two patterned layers; film thicknesses and thickness uniformities; measurements that occur after actions of a single tool; measurements that occur after all of the tools of a single process module; measurements that occur after multiple process modules; and a combination thereof.

At block 220, the system selects an appropriate mathematical function of the 2D spatial coordinates (x, y), or (r, θ) to model the data. In one embodiment the model function is a finite series of basis functions and the numerical coefficients with which each term of the series is weighted is referred to as the coefficient vector or FP of the data, as explained above. The basis functions are generally orthogonal functions such as, Zernike polynomials, Legendre polynomials, or Bessel functions, or the like, and are chosen such that the in-line measurement type of interest may be accurately modeled without having to use a very long series requiring long computation times, and the characteristics of the model are comparable to some physical components of the in-line measurement step (e.g. radial characteristics of a spin coating process).

At the next block 230, the system 200 executes a computation that optimizes the finite set of coefficients for the best fit to the obtained spatial measurements of a measurement type to obtain the respective FP model, in accordance with an optimization algorithm. An FP model may be generated for each measurement type of in-line fabrication metrology data obtained at the process step. These measurement FP's are the first (lowest) level of FP's.

The in-line measurement and generation of the respective FP is illustrated in FIGS. 3A-3C. FIG. 3A depicts in-line fabrication metrology raw data of a measurement type obtained from one or more wafers processed at the immediate process step using baseline processing. The graph displays the data as a wafer map of tessellated rectangles located at the spatial coordinates of the respective measurement type and shaded using a grayscale to represent a numerical value of the respective data. The data depicted in FIG. 3A is then modeled using a finite (e.g., 21-term) series of Zernike polynomials which are functions of the polar coordinates (r, θ).

The optimized set of 21 coefficients is displayed as a histogram in FIG. 3B, where the horizontal axis is the order of the Zernike polynomial and the vertical axis is the respective coefficient strength. In some embodiments, the number of terms may be adjustable, for example, higher order polynomials may be added to the series if the minimum fit error after optimization is higher than an acceptable threshold.

As seen in the histogram in FIG. 3B, some of the coefficients are relatively small relative to others, indicating that it may be possible to simplify the model without introducing excessive fit error because the contribution of each term is proportional to the strength of its respective coefficient. However, it is important to also consider that the basis functions are functions of the 2D spatial coordinates and, therefore, the relative contribution of the terms also depend on the location on the surface of the wafer. For example, a term that is dominant near the center of the wafer may be weak near the edge of the wafer.

In FIG. 3C, the contributions of five terms having the five highest coefficient strengths are plotted as 3-dimensional surfaces over the x-y plane of the wafer surface. As seen from the histogram in FIG. 3B, the top five coefficients are those for the $4^{th}$, $12^{th}$, $10^{th}$, $21^{st}$, and $14^{th}$ order Zernike polynomials. Graphs, such as those in FIG. 3C help to reduce the complexity of the model. A less complex FP model provides the advantages of reducing computation time to generate process models and performing subsequent analysis, as described further below.

Next, at block 240 in this embodiment, transfer functions are obtained to decompose the measurement FP's at the current process step in order to model the influence of a previous process step on the outcome of in-line measurement of wafer characteristics obtained at the present process step. In another embodiment, the transfer functions may be generated after the generation of all the measurement FP's and higher level FP's (using combinations of measurement FP's and calculations) of the present process step is completed. As discussed above, the transfer function may be implemented and extracted using various techniques, for example, transformation matrices, statistical correlation functions, etc.

As indicated in block 240 of the flowchart of system 200 in FIG. 2, in this embodiment, the method to extract the transfer functions considers that the memory of previous processing is embedded in the state of the incoming wafer. In order to have a robust method of partitioning the coefficient vector of the measurement FP at the immediate process step, a set of incoming wafers may be generated by intentionally varying the process conditions at some earlier process step. For example, the measurement FP of a resist CD at a photoresist develop step is expected to correlate with the planarity of the wafer surface on which the resist pattern is being formed. Accordingly, process parameters of a previous planarization process step may be varied intentionally from the baseline process flow to generate incoming wafers, wherein each wafer has a different planarity FP obtained at the planarization step. The response of the coefficient vectors of the resist CD measurements to the variations in the planarity FP's of this specially prepared set of non-baseline incoming wafers is then analyzed to identify the sensitivity of the deviation of each coefficient of the resist CD FP from its baseline value. This information may be used to define a transformation matrix that may map the coefficient vector of planarity FP's of all incoming wafers onto a respective resist-CD response vector (referred to as the transferred vector) which is the part of the resist-CD coefficient vector that is expected to include all the correlation with the planarity FP of the wafer at the planarization step. This response vector captures the memory of the planarization process and may be subtracted from the resist-CD measurement FP to obtain the uncorrelated component (referred to as the immediate step vector) of the resist-CD coefficient vector that is expected to correlate more strongly with the processing conditions at the immediate process step.

The transformation matrix, in the example embodiment described above, is a mathematical implementation of a transfer function. It is understood, that other mathematical implementations are possible, as mentioned above.

The transfer functions for a particular baseline wafer fabrication process flow need not be generated each time a batch of wafers is processed by the wafer fabrication production line. The transfer functions may be generated once and stored electronically to be available for future use. Periodically, the transfer functions may be updated as modifications are made to the baseline wafer fabrication process flow.

In the example embodiment illustrated by the flowchart in FIG. 2, system 200 creates a process model for the process step from the response of the immediate step vectors of the measurement FP's of that step. The steps for creating this process model is outlined in blocks 250, 260, and 270 and described with reference to FIG. 4.

In block 250, the system 200 obtains in-line fabrication measurement data from a set of wafers processed using several process parameter values at and around those prescribed in the baseline wafer fabrication process flow. Each process parameter is associated with different adjustable equipment settings at the process step for which the process model is to be created. For example, some process may allow the conditions (e.g., etch rate, etch time, gas concentration, etc.) to be adjusted based on controls available for one or more tools of the process. In that case, those process conditions are process parameters.

Figure 4A:
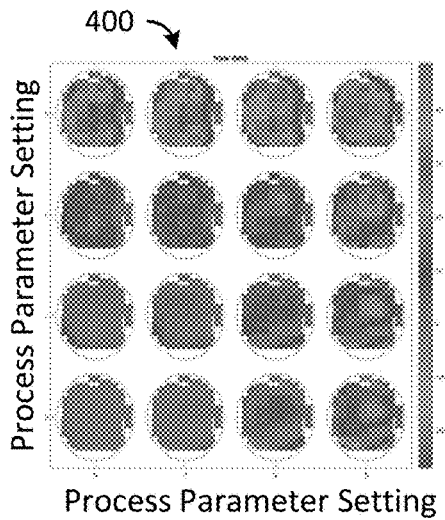
FIGS. 4A-4D illustrate a portion of an example method wherein a process model of a measurement fingerprint of an in-line measurement type is generated, in accordance with one embodiment.

FIG. 4A illustrates an example of raw data depicted graphically by a 4×4 matrix of wafer maps 400 of in-line measurement data. Each wafer map of the example matrix in FIG. 4A corresponds to measurements of the same measurement type performed on one or more wafers processed using a specific process parameter vector comprising a pair of values for two process parameters, a first process parameter $par_1$ and a second parameter $par_2$. For example, $par_1$ may be the etch rate, and $par_2$ may be etch time. In general, the number of process parameters being varied may be other than two. Also, measurements of more than one measurement type may be performed. The raw data in FIG. 4A is displayed such that the wafer maps along a row of the 4×4 matrix correspond to four parameter values for $par_1$, while the parameter values for $par_2$ remain unchanged; and the wafer maps along a column correspond to four parameter values for $par_2$, while the parameter values for $par_1$ remain unchanged.

Figure 4B:
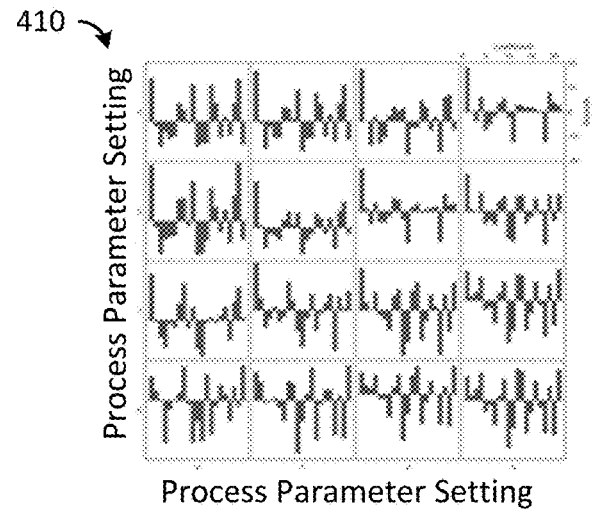

Also in block 250, the system 200 generates FP models of the raw data obtained from a set of wafers processed using the different process parameter vectors, as described above with reference to FIG. 4A. One FP model is generated from raw data obtained from each process parameter vector. For example, the 16 histograms depicted in FIG. 4B are the respective FP models of the raw data depicted by the 16 wafer maps depicted in FIG. 4A. The model function is a 21 term series of Zernike functions, similar to that described with reference to FIG. 1B. Each bar is a coefficient of a 21-component coefficient vector of a FP model for the measurement type corresponding to the respective process parameter vector ($par_1$, $par_2$).

Still referring to block 250, system 200 may utilize the available transfer functions for the baseline process flow to decompose the measurement FP coefficient vectors in FIG. 4B to obtain the immediate step vector of each measurement FP by subtracting the transferred vector from the coefficient vector. As described above, in this embodiment, each coefficient of the coefficient vector is split or decomposed into two pmts. A first part is equal to the respective coefficient of the transferred vector calculated using the transfer functions. The first part represents correlations with one or more FP's obtained at earlier process steps. The remaining second part is then equal to the respective coefficient of the immediate step vector that represents the part determined by the process conditions of the immediate process step. It is desirable to use the immediate step vectors to generate a process model in order to prevent the parameters of the process model of the immediate process step from being influenced by process parameters at one or more of the earlier process steps.

At block 260, the system 200 selects model functions to model the response of each coefficient of the immediate step vector of a fingerprint to changes in the process parameters (e.g., $par_1$ and $par_2$). A different model function may be used to model each of the coefficients of the immediate step vector, for example, the 21 coefficients of a 21-term series of Zernike polynomials denoted by $a_1, a_2, \ldots a_i, \ldots a_{20}, a_{21}$ in FIG. 4C. In the example illustrated in FIG. 4, there are 16 instances for each coefficient, $a_i$, corresponding to the 16 process vectors used at the process step in order to generate the 16 wafers and respective FP's.

Figure 4C:
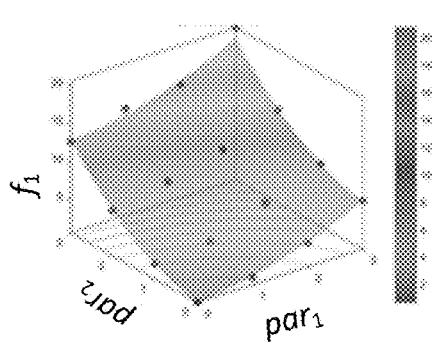

The model parameters of the model functions selected at block 260 are adjusted in block 270 for the best fit to the 16 values of each coefficient, $a_i$, to generate an optimized process model for the process step, the process model comprising the 21 model functions denoted by $f_1, f_2, \ldots f_i, \ldots f_{20}, f_{21}$ in FIG. 4C. Each of the functions $f_i$ has been optimized in accordance with an optimization algorithm. The first two process models, $f_1$ and $f_2$, are depicted graphically in FIG. 4C as three-dimensional (3D) surfaces plotted as a function of two process parameters, $par_1$ and $par_2$. The 16 points near each of the 3D surfaces are the 16 values $a_1$, and $a_2$ which were used to create the models $f_1$ and $f_2$, illustrate a good fit between the predictions of the process model and the coefficients of the immediate step vector of the FP model.

Figure 4D:
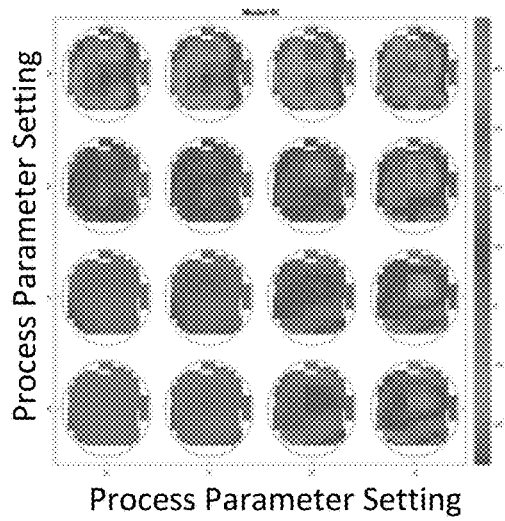

FIG. 4D illustrates the wafer maps calculated from the FP models and the associated process model. A comparison of the wafer maps in FIG. 4D with the wafer maps of the raw data in FIG. 4A shows a good fit, thereby illustrating the predictive capability of the FP models along with the associated process model in reproducing the in-line fabrication metrology data, including its spatial information, over a process parameter space around a baseline processing condition.

The process model for process steps in a baseline wafer fabrication process flow may also be generated once and stored electronically to be available for future use, similar to the baseline transfer functions. Also similar to the transfer functions, periodically, the process model may be updated as modifications are made to the baseline process.

Fingerprints of the baseline in-line wafer fabrication metrology data may be generated more frequently for real-time yield analysis and advanced process control (APC), especially for process steps that strongly impact manufacturing yield. A reference set of FP's may be archived to compare with those obtained from the running production line to detect, analyze, and correct abnormalities.

At block 280 in the flowchart in FIG. 2, the lowest level FP's (which are the measurement FP's) may be combined and calculations may be used to create higher level FP's and an associated process model capable of accurately predicting the relevant metrics of the process steps. In order to combine multiple FP's having different units, it may be necessary to normalize the values of the coefficients to obtain consistent units.

As described above, the FP models, transfer functions, and associated process model, generated using in-line measurements that include 2D spatial coordinates of the measurement locations can be used advantageously in a wafer fabrication manufacturing system. As mentioned earlier, and indicated in block 290, the system 200 may identify the dominant coefficients of the FP's and dominant parameters of the process model. This may help not only in simplifying the model by eliminating the less significant parameters of the model but also provide useful insight into the impact of the process parameters, equipment settings, and equipment selection on manufacturing yield. The models may be used in monitoring and ameliorating yield loss in conjunction with an APC tool, and even be used to improve the baseline wafer fabrication process flow to provide higher manufacturing yield, as described further below.

Figure 5:
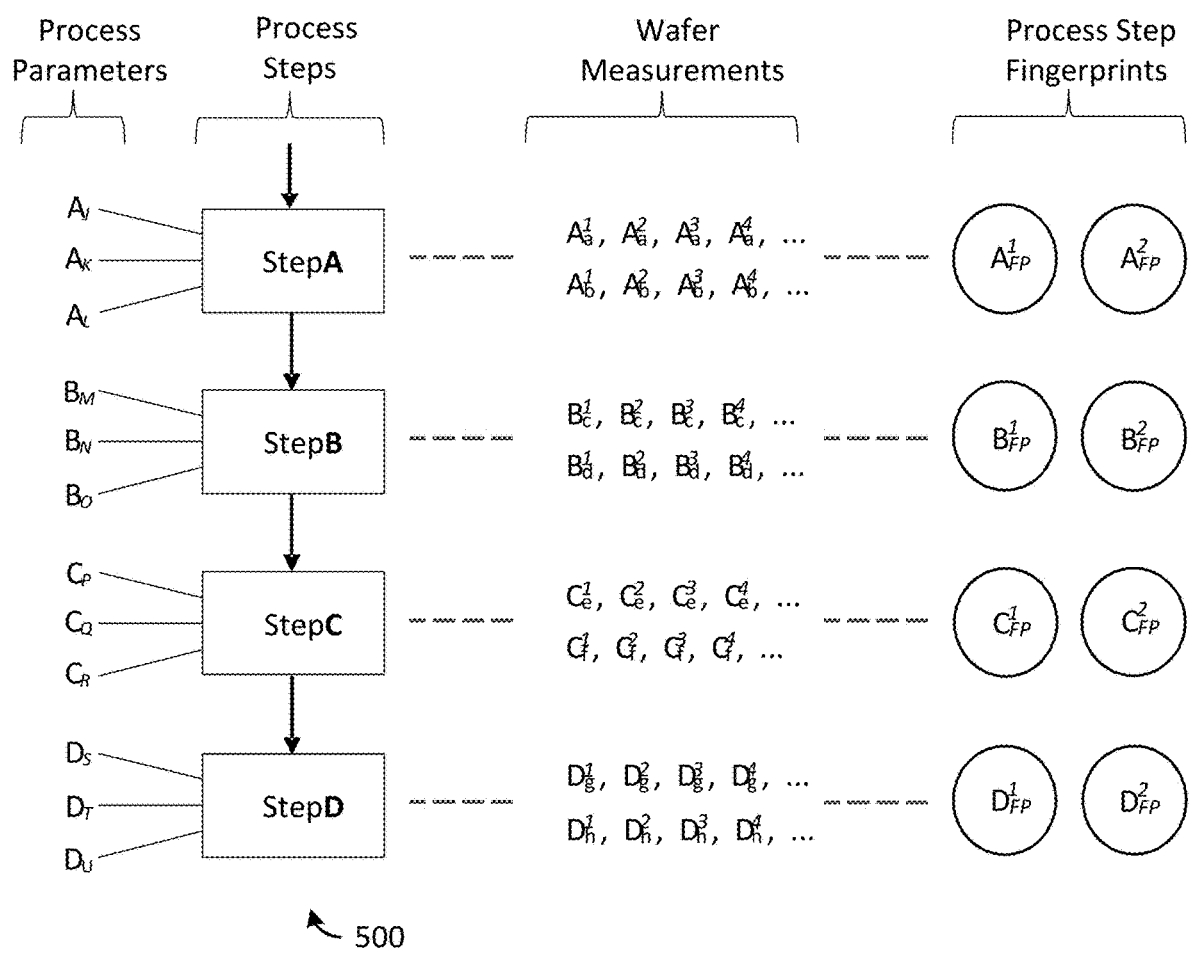
FIG. 5 is a flowchart illustrating a portion of an example method in a wafer fabrication manufacturing system used for generating fingerprint models, transfer functions, and process model of a process module from in-line measurements of wafer fabrication metrology, in accordance with one embodiment.

The flowchart in FIG. 5 illustrates a portion of a flow that may be used to generate fingerprints of metrics for a process module or layer 500, for example, active layer, gate layer, contact layer, metal layer, and the like, each layer comprising one or more process steps. At each process step, the FP's, transfer functions, and process models, for the respective process step may be generated by the manufacturing system, such as the system 200, using, for example, the flow described with reference to the flowchart illustrated in FIG. 2.

The FP's, transfer functions, and process model for the layer (e.g., layer 500) may be generated by combinations and calculations using the FP's, transfer functions, and process model for each process step. An example method of generating a layer FP is explained with reference to a flowchart in FIG. 6.

In the example illustrated in FIG. 5, the layer 500 comprises four representative process steps (A, B, C, D) such as resist coat, exposure, develop, resist strip, and the like. Although four process steps are shown for example purposes, the layer 500 may include any number of steps. The inputs provided to each process step are the incoming wafers along with the FP's and transfer functions generated at earlier process steps.

The process step (e.g., step A, B, C, or D) comprises processing equipment for wafer fabrication such as coater, scanner, plasma etcher, test equipment, and the like, and associated chemicals, vacuum pumps, temperature controller, and the like, as known to a person skilled in the art. Along with the equipment, each process step includes process recipes comprising process parameter values, timing information, and instructions for processing the incoming wafers. The equipment has adjustable settings which may be used to control adjustable process parameters such as etch rate, gas flow, exposure level, spin speed, and the like. Each process parameter is represented in FIG. 5 by a unique upper-case, italic subscript (J through U). For example, the adjustable process parameters for the process step A are $A_J$, $A_K$, and $A_L$, as seen in the first column in FIG. 5.

One or more incoming wafers may be processed at a process step by executing one or more process recipe selected to obtain a desired outcome, for example, deposit a film of a desired material and thickness. The processing may be monitored using various sensors, and the processing equipment may be controlled by an APC system to ensure that the process parameters achieve outcomes as intended by the process recipe. By default, the wafers are processed in accordance with a baseline process recipe of the baseline wafer fabrication process flow.

As described above, in-line measurements of wafer characteristics are collected as the first step in the FP model generation flowchart in FIG. 2. Measurements of multiple types may be done (e.g., deposited film thickness, resist CD of a first line, resist CD of a second line, step-height, leakage current, and the like), each measurement type having a unique letter as subscript. There are eight measurement types shown in FIG. 5 denoted by eight subscripts (a through h). The in-line wafer fabrication metrology data may be gathered from multiple wafers, but the set of locations on a wafer may be the same for all wafers measured at a given process step (e.g., step A) and for a fixed measurement type (e.g., type a). The spatial information is retained by associating each data point with the 2D spatial coordinates of the location on the wafer from where the data was acquired.

In FIG. 5, each data point of the same measurement type is identified by a unique italicized numeral as superscript (1, 2, 3, 4, etc.). Accordingly, the set of wafer measurements of type a (including the spatial information) at process step A is denoted by $\{A_a^1, A_a^2, A_a^3, A_a^4 \ldots\}$. In the example in FIG. 5, two types of measurements are performed at each of the four process steps, a total of eight types in the process module 500.

The lowest level FP models may be generated from the in-line wafer fabrication metrology data at each step, for example, at step A there may be two measurement FP's: one FP for the dataset $\{A_a^1, A_a^2, A_a^3, A_a^4 \ldots\}$ and another FP for the dataset $\{A_b^1, A_b^2, A_b^3, A_b^4 \ldots\}$. Fingerprints for the process step created using combinations and calculations of the measurement FP's are denoted in FIG. 5 by the process step name with the subscript FP and a numeric superscript to identify each process step fingerprint. For example, in FIG. 5, the two process step FP's at step A are shown as $A_{FP}^1$ and $A_{FP}^2$. Various combinations of the two measurement sets $A_a^n$ and $A_b^n$ can be used to arrive at the two process step fingerprints. For instance, in one case, measurement set $A_a^n$ is used to create process step fingerprint $A_{FP}^1$, and measurement set $A_b^n$ is used to create process step fingerprint $A_{FP}^2$. In another case, measurement sets $A_a^n$ and $A_b^n$ are used together to create process step fingerprint $A_{FP}^1$, and either measurement set $A_b''$ or $A_b'''$ alone is used to create process step fingerprint $A_{FP}^2$. Multiple other combinations are also possible, with each process step fingerprint being created from one or more sets of wafer measurements, using various weighting, scaling, averaging, fitting and/or other techniques. Although two process step fingerprints are shown for each process step for example purposes, each process step may include one or more process step fingerprints.

Transfer functions for each process step may be generated from the correlations between the FP models generated at earlier process steps and the measurement FP's of the immediate process step. One example method of identifying the correlations, explained in the description of the flowchart in FIG. 2, comprises generating a set of non-baseline wafers by intentionally varying the process parameters at an earlier process step (e.g., step B in FIG. 5) and then using the wafers as incoming wafers processed at the immediate process step (e.g., step C) using the baseline process recipe. The response of the measurement FP's at the immediate step C to the intentional variations in the FP's at the previous step B provides the information to generate a transformation matrix as the transfer function that predicts changes in the measurable outcomes of process C from the wafer characteristics observed at process step B. As mentioned above, it may be possible to define other methods to generate transfer functions other than transformation matrices to model the influence of wafer characteristics at one process step (e.g., step B) on the outcomes of processing at a subsequent process step (e.g., step C).

Once all the transfer functions for a process step (e.g., step A to be specific) are defined, each measurement FP of step A, represented by a respective coefficient vector, may be decomposed into a transferred vector that correlates with previous processing and an immediate step vector that is decoupled from the process parameters of previous process steps. This decoupling provides the advantage of creating an accurate process model for step A from a set of in-line wafer metrology data obtained from a set of wafers fabricated by varying only the process parameter vector $(A_J, A_K, A_L)$ of step A, using the method described above with reference to FIGS. 2 and 4.

It is understood that the description and explanation of methods by which fingerprints, transfer functions, and process models of a process step or a layer comprising a collection of process steps may be generated are provided herein as examples and should not be considered as limiting. As mentioned above, methods other than the described methods are also possible and these alternative methods may be derived from the descriptions and explanations provided in this disclosure.

The process models for the lower level measurement FP's may be extended to create a process model for the higher level FP's derived from the measurement FP's. The combinations and calculations used to generate the two process step FP's $A_{FP}^1$ and $A_{FP}^2$ may be utilized to create a process model for the process step A by respective combinations and calculations of process models for the measurement FP's.

Figure 6A:
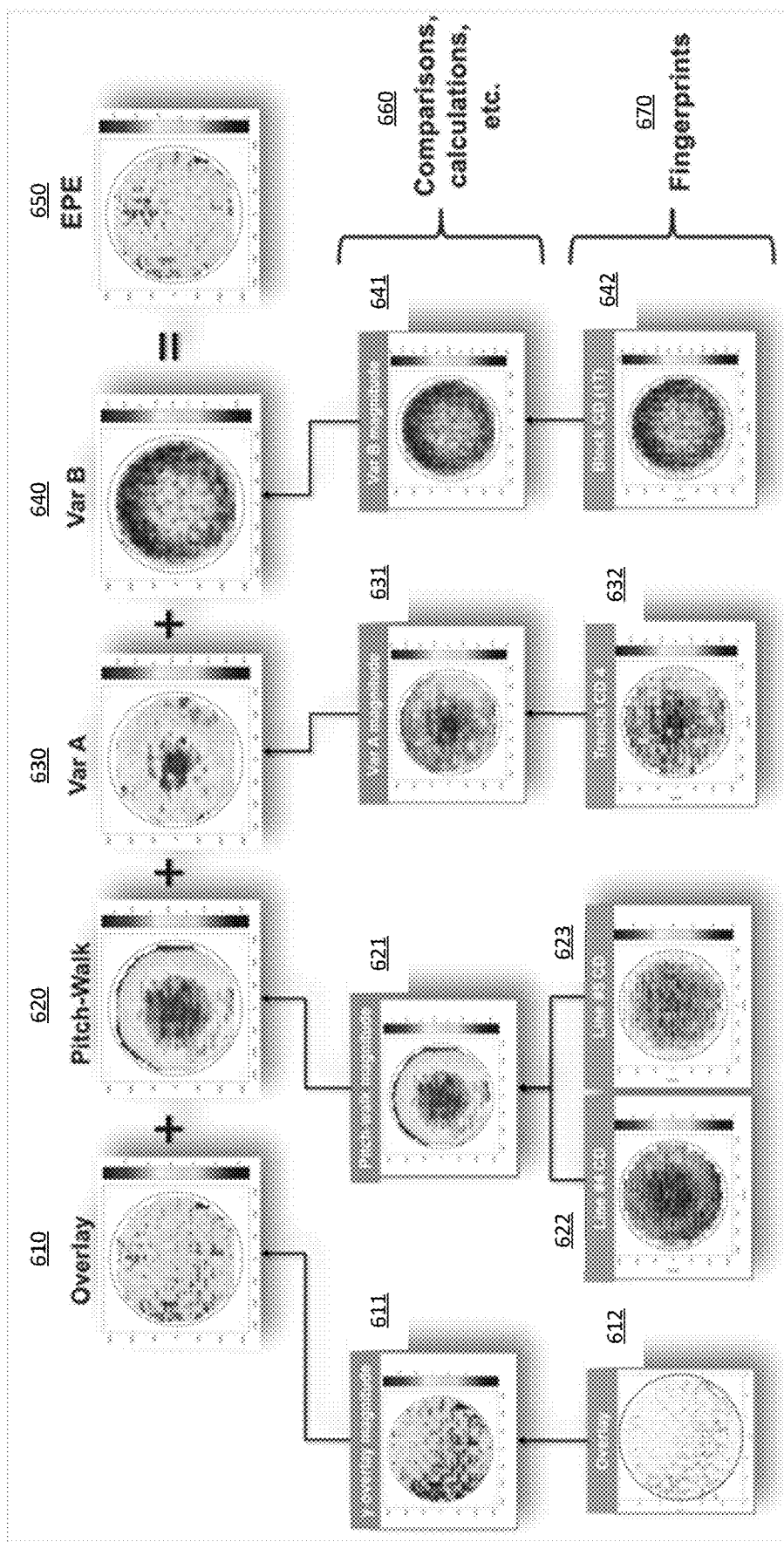
FIG. 6A-6C illustrate an example method of generating a hierarchy of fingerprints from measurement fingerprints, in accordance with one embodiment.
Figures 6B, 6C:
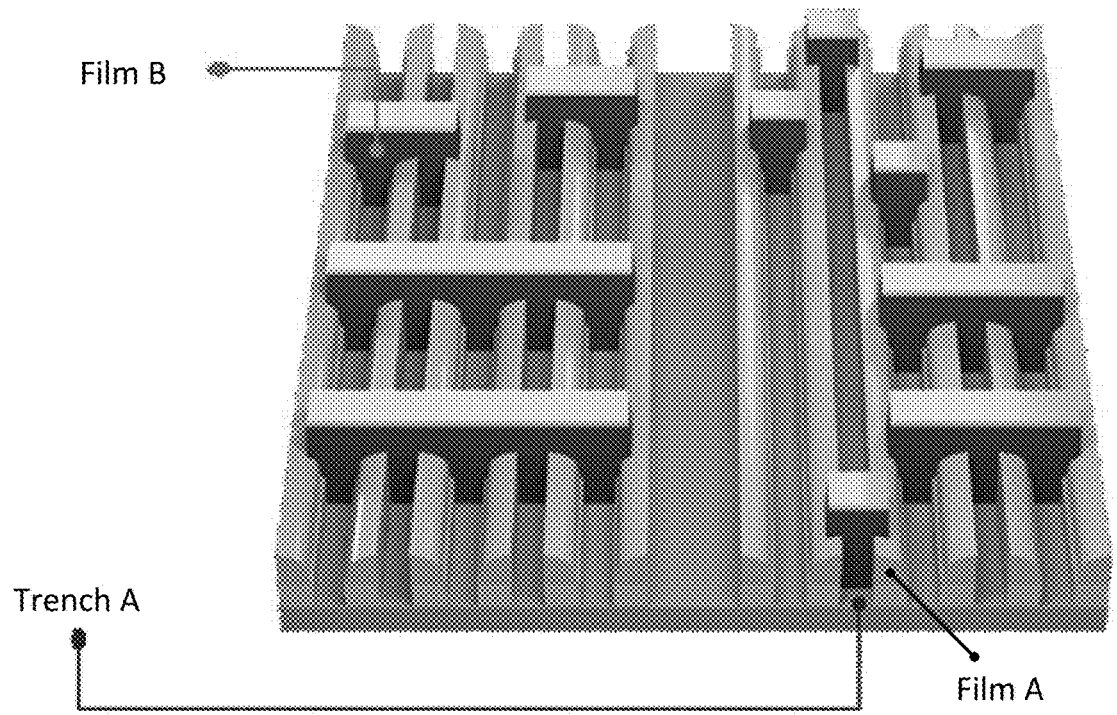

FIGS. 6A-6C illustrates an example of the method by which a hierarchy of FP's may be generated by combinations and calculations of lower level FP's. In particular, a layer-level FP for EPE (referred to as $EPE_A$) is generated in FIG. 6 starting from measurement FP's (the lowest level) obtained from in-line measurements using a flowchart illustrated in FIG. 6A. An example equation that may be used to compute $EPE_A$ is displayed in FIG. 6B. FIG. 6C illustrates a perspective view of a fabricated structure to explain that the in-line wafer fabrication metrology data used to obtain the measurement FP's may be collected at different process steps. In this example, the process steps belong to a process module, referred to as the metal-1 layer. The raw in-line data are collected from measurements involving two patterned films formed in the metal-1 layer, a first film A and a second film B, illustrated in FIG. 6C.

Five fingerprints, collectively shown as FP's 670, form the set of measurement FP's {612, 622, 623, 632, 642} from which higher level FP's are obtained in the flowchart illustrated in FIG. 6A. Higher level FP's, 611, 621, 631, and 641, are generated in the flow in FIG. 6A from the measurement FP's 670 using various comparisons, calculations or other processes, collectively indicated as the comparisons, calculations, etc. 660. These fingerprints may be further compared and processed to arrive at aggregate, representative or resulting fingerprints for overlay $(OL)_{AB}$ 610, pitch walk $(Pwalk_A)$ 620, variable A $(Var_A)$ 630 (e.g., a trench critical dimension (CD)), and variable B $(Var_B)$ 640 (e.g. CD of a block). The subscripts A and B refer to metrics pertaining to the films A and B, respectively, and subscript AB is used for metrics which involve both the films A and B.

As next illustrated in the equation displayed in FIG. 6B, the FP's 610, 620, 630, and 640 are used to calculate a fingerprint $EPE_A$, which is the layer-level fingerprint for the edge placement error for the patterned film A. Methods, similar to the method explained herein may be applied to generate other fingerprints relevant to the wafer fabrication manufacturing system and the manufacturing yield of the baseline process flow.

The elements of the set of measurement FP's in the example flowchart in FIG. 6A are Overlay 612, Line #4 CD 622, Line #5 CD 623, Trench #4 CD 632 and Block 1T CD 642. The raw in-line wafer fabrication metrology data for these measurement FP's involve two patterned films, a first patterned film A (formed using a self-aligned quadruple patterning (SAQP) technique) and a second patterned film B, as illustrated in FIG. 6C. Measurement FP Overlay 612 uses measurements of overlay error between these two patterns. Fingerprints Line #4 CD 622 and Line #5 CD 623 are extracted from line and space measurements gathered at one or more of the SAQP process steps performed to form the patterned film A and used subsequently to calculate a multiple-patterning metric called pitch-walk. The FP Trench #4 CD 632 may be generated from measurements of the space between a pair of adjacent lines of the patterned film A in FIG. 6C created by a processing technique comprising formation of a pair of self-aligned spacers on the opposing sides of a disposable mandrel. Fingerprint Block 1T CD 642 uses linewidth measurements of a geometric feature involving critical dimension in the pattern of the patterned film B in FIG. 6C. It is apparent from the description of the measurements provided herein that the resultant layer FP $EPE_A$ incorporates in-line wafer fabrication metrology data gathered at different process steps.

Still referring to FIG. 6A, the higher level FP's 611, 621, 631, and 641, generated using various comparisons, calculations, and combinations 660, represent several metrics relevant for calculating the edge placement error of a feature in the pattern of the patterned film A. A magnitude of the y-overlay error derived from Overlay 612 is represented by FP 611; a magnitude of pitch-walk in film A derived from Line #4 CD 622 and Line #5 CD 623 is represented by FP 621; Trench #4 CD 632 determines a magnitude of a geometric variable/CD 631 in Film A; and Block 1T CD 642 determines a magnitude of a geometric variable/CD 641 in Film B. The comparisons, calculations and combinations may be of various types, for example, simple algebraic operations, analytic linear and non-linear functions, vector functions, geometric transformations, statistical analysis, computer algorithms of numerical methods, or the like, or combinations thereof.

As mentioned above, the higher level FP's may be further processed to arrive at the fingerprints $(OL)_{AB}$ 610, $Pwalk_A$ 620, $Var_A$ 630, and $Var_B$ 640, which are used in the exemplary equation 680 displayed in FIG. 6B. This exemplary equation defines a metal-1 layer-level FP, $EPE_A$, which may be used to compute the edge placement error for the layer. In this equation, $(MP)_A$ refers to the geometric line-space ratio of minimum pitch lines, $Preg_A$ refers to pattern registration error (a patterning error originating from the photomask, hence the same error is repeated on every exposure field), and $Lspec_A$ represents a geometric line specification from the pattern design. In the equation 680, $Var_A$, $Var_B$, $Preg_A$, $(OL)_{AB}$, and $Pwalk_A$ are fingerprints, and $(MP)_A$ and $Lspec_A$ are constants. The items $Preg_A$, $(MP)_A$, and $Lspec_A$ are additional fingerprints/constants not illustrated in FIG. 6A but are used in equation 680 as an illustration. The equation may include various constants obtained from independent sources such as specification documents for the photomask, manufacturer's specifications for processing equipment, and the like.

Layer-level FP's, such as the layer-level FP $EPE_A$, may be used to perform a pareto analysis to identify the dominant factors affecting the metrics of the layer, and thereby the manufacturing yield. For example, calculations using the equation in FIG. 6B can rank order the contributions of overlay error, pitch-walk in the pattern of film A, variability in trench width of trenches in film A, and linewidth variations of lines in film B to the EPE of the layer. In one example, such a pareto analysis reveals that the most dominant factor is the overlay error contributing about 55% of the total edge placement error, and that the impact of trench width variation is negligible with a contribution of only about 1%. In this example, the contributions to the EPE are aggregates obtained by combining all spatial locations on the wafer. More targeted analysis may be performed which may further analyze the yield loss at particularly vulnerable regions on the wafer, for example, the region near the edge of the wafer. Such analyses can be used to improve the baseline process flow and manufacturing yield.

Figure 7:
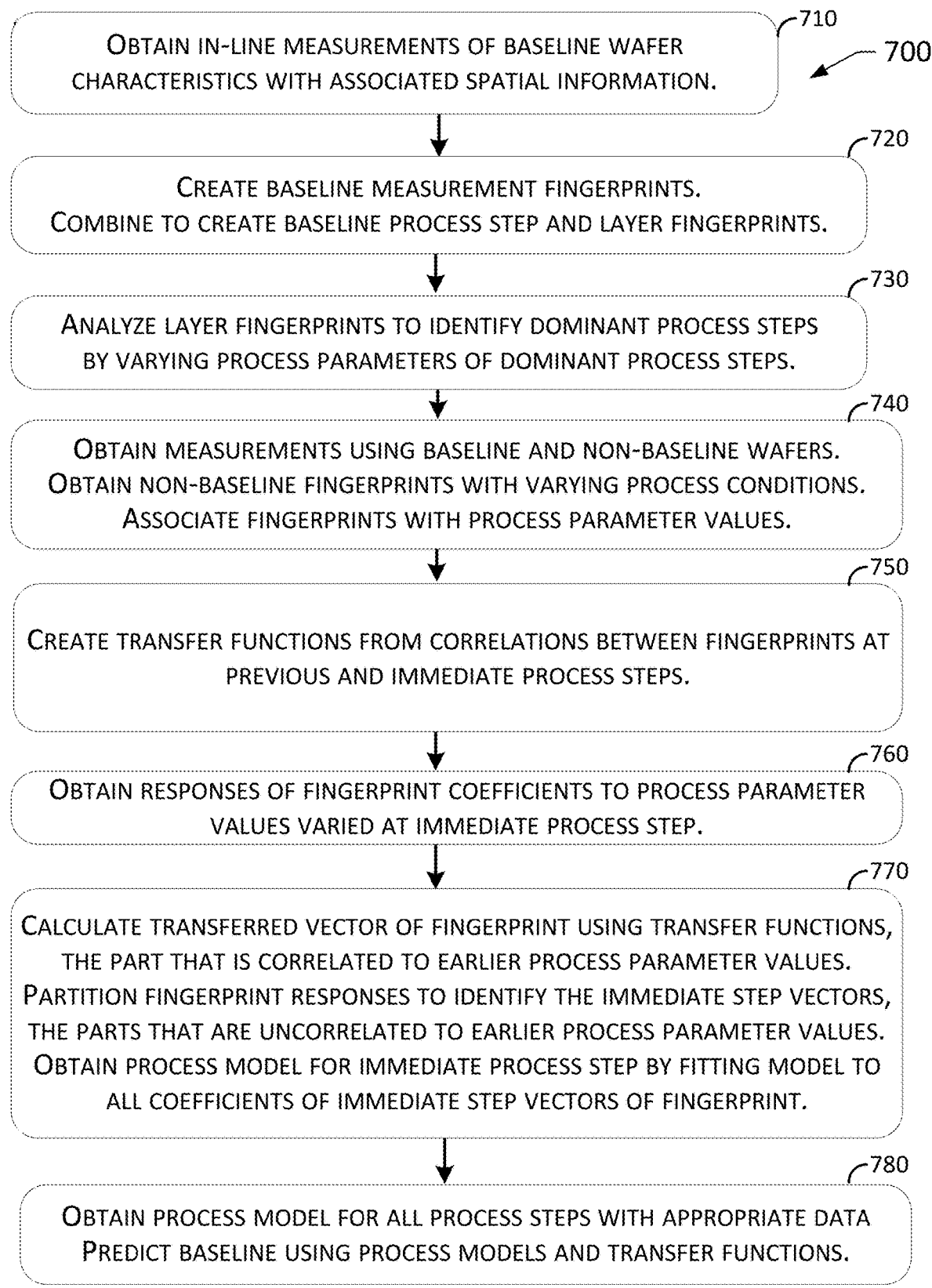
FIG. 7 is a generalized flowchart illustrating an example method of generating a model for a baseline process flow, in accordance with one embodiment.

A more general flowchart illustrated in FIG. 7 describes an embodiment of a flow whereby a system 700 may extend the methods and techniques described above to create transfer functions and process models for a process step to create transfer functions and process models to predict fingerprints of metrics and hence, wafer characteristics at any step in the baseline wafer fabrication process flow.

At block 710 of the flowchart in FIG. 7, in-line measurements with associated spatial information is obtained from wafers processed in accordance with the baseline process flow. This in-line wafer fabrication metrology data may be used to generate measurement FP's and higher level FP's characterizing the entire baseline process flow, as indicated in block 720. Then, at block 730, non-baseline wafers may be generated by varying the process parameters at the process steps of the baseline process flow. Since advanced process flows are complex, involving hundreds of process steps, it may be advantageous to first identify dominant process steps that affect manufacturing yield using, for example, a pareto analysis similar to the one described above utilizing the equation for the layer-level fingerprint EPE, displayed in FIG. 6B. At block 740, the in-line measurements and respective fingerprints are obtained using the wafer metrology data and associated process parameter values of the non-baseline wafers generated at block 730.

Subsequent blocks in FIG. 7 illustrate how the information captured from the in-line measurements with associated spatial coordinates and process parameter values may be utilized to create a predictive model for the baseline process flow.

At block 750, transfer functions are created to model correlations between variations in wafer characteristics at one process step with wafer characteristics at a subsequent process step. The variations at the earlier process step may be caused either by natural deviations in processing conditions or generated intentionally by varying adjustable process parameters. The responses of all the coefficients or parameters of a fingerprint to the process parameters intentionally varied at a specific process step are obtained at block 760.

At block 770, the component of the fingerprint responses that correlate with processing at previous process steps is calculated from the transfer functions. Then the component that is uncorrelated to the earlier process steps may be partitioned out. This component is fit to a mathematical model to obtain a process model of the immediate process step.

Process models for all the process steps which may have been selected at block 730 as a dominant process step may be generated using the method described above, as indicated in block 780. At block 780, the wafer characteristics with associated spatial information at any step of the baseline process flow may be predicted using the baseline fingerprints, transfer functions, and process models.

The fingerprints, transfer functions, and process models collectively provide a mathematical model for a wafer fabrication process flow that may be used by a wafer manufacturing system. Once such a model is created, it can be used by a manufacturing system to predict, optimize, adjust and/or control one or more of the process steps in order to achieve desired improvements in the manufacturing yield in production of wafers. In other words, using the model, process conditions may be modified/altered and thus a plurality of wafers comprising semiconductor dies can be manufactured at a higher yield resulting in a decrease in manufacturing costs.

For example, dominant process steps identified by analyzing the baseline fingerprints may be monitored more frequently. The fingerprints generated from in-line metrology data collected for monitoring the production line may not only detect wafers that fail specification (referred to as non-conformity) but also identify the spatial coordinates of regions of high non-conformity or high density of non-conformities. Such information is advantageous in detection and determination of systemic non-conformities. The process models may be used to identify one more pieces of equipment which could be possible sources of manufacturing yield loss and provide the information for the system to adopt a single-tool or a multi-tool process control strategy. Moreover, when used in conjunction with an APC tool, the model may assist the manufacturing system to suggest or recommend adjustments to the particular process parameters for amelioration of non-conformities to recover the yield loss. In some instances, the system may directly adjust the particular process parameters.

Additionally, the process model and transfer function may be used to improve the baseline process flow. For example, the system may use the process model to optimize process parameters so that the optimized fingerprint improves a target metric, such as EPE. The optimized process parameters may be fed into the process as the new plan-of-record (POR) thereby improving the manufacturing yield of the baseline process flow.

This may be described in this manner: The system obtains a target range of values of the associated predicable characteristics of a target semiconductor wafer. This target range is the range of acceptable or desirable values for an acceptable or desirable semiconductor wafer produced by the semiconductor wafer fabrication process. For example, a customer may specify the range of acceptable values for EPE.

Using the process model, the system optimizes one or more of the process parameters of semiconductor wafer fingerprints so that the values of associated predicable characteristics of the semiconductor wafers produced by the semiconductor wafer fabrication process fall within the obtained target range. That is, using the process model, the system calculates a value of one or more of the process parameters that effectively produce the values of the associated predicable characteristics that would fall within the obtained target range. Of course, in some implementations, range may be a plus/minus range about a target value.

Furthermore, because this process model preserves the spatial characteristics the process parameters which affect the EPE at specific regions of high non-conformities may be identified and adjusted for improved manufacturing yield.

The methods illustrated in FIGS. 2 and 7 as well as the associated FIGS. 1, 3-6 may be implemented in or using a non-transitory computer-readable storage medium comprising instructions that when executed cause a processor of a computing device to perform operations in coordination with a semiconductor wafer fabrication process. In addition, some of the instructions for performing the steps of FIGS. 2 and 7 may be stored in separate locations in different non-transitory computer-readable storage medium and may be configured to be performed in different processors of different computing devices. Examples of non-transitory computer-readable storage medium include various types of memories including non-volatile solid state memories, and other storage mediums. For example, non-transitory computer-readable storage medium may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and Secure Digital (SD) cards), and volatile and non-volatile memory (e.g., random access memory (RAM), read-only memory (ROM)).

For example, the steps 220 to 290 of FIG. 2 may be instructions that are configured to be executed in one or more processors, which result in the developing of a process model. Similarly, the steps 720 to 780 of FIG. 7 may be instructions that may be configured to be executed in one or more processors, which result in the developing of a process model.

Figure 8A:
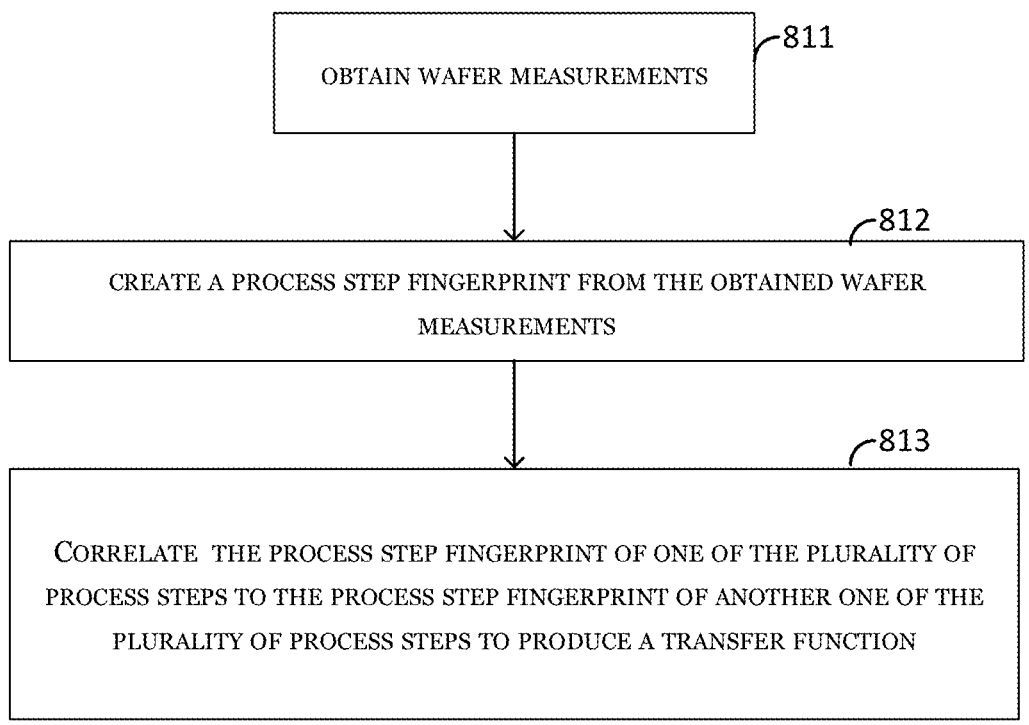
FIGS. 8A-8C illustrate a portion of an example method in a wafer fabrication manufacturing system used for generating fingerprint models, transfer functions, and process model of a process step from in-line measurements of wafer fabrication metrology, in accordance with one embodiment.
Figure 8B:
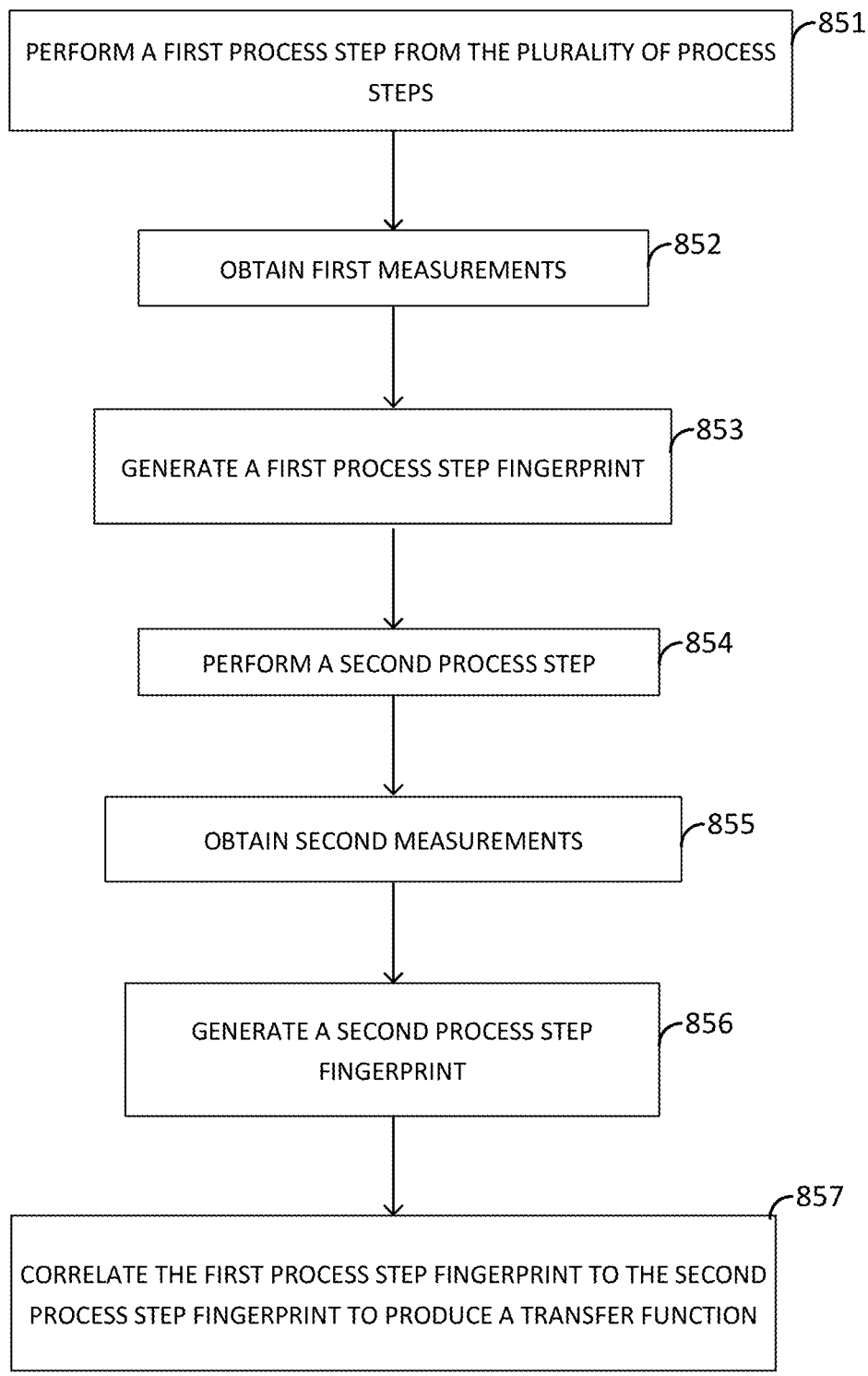
Figure 8C:
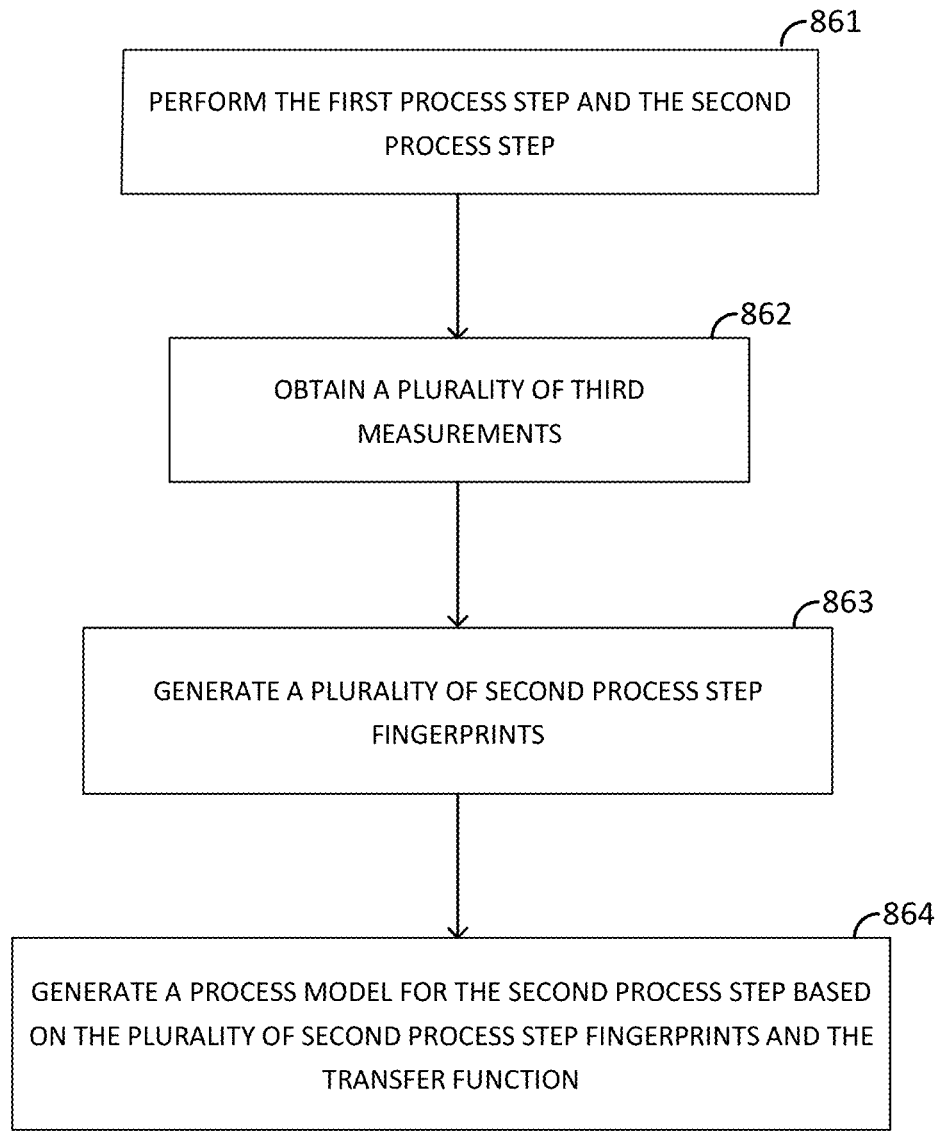

FIGS. 8A-8C illustrate a portion of an example method in a wafer fabrication manufacturing system used for generating fingerprint models, transfer functions, and process model of a process step from in-line measurements of wafer fabrication metrology, in accordance with one embodiment.

FIGS. 8A, 8B, and 8C may be implemented in specific embodiments as described in FIGS. 2 and 7.

Referring to FIG. 8A, a method includes obtaining wafer measurements of a characteristic of a semiconductor wafer at each of a plurality of process steps during a semiconductor wafer fabrication process (block 811), for example, as described in block 210 of FIG. 2, block 710 of FIG. 7, where each of the wafer measurements is associated with a spatial location on the semiconductor wafer from which the measurement is obtained. The method further includes creating a process step fingerprint from the obtained wafer measurements for each process step (block 812), for example, as described in blocks 220-230 of FIG. 2, blocks 720-740 of FIG. 7. The method further includes correlating the process step fingerprint of one of the plurality of process steps to the process step fingerprint of another one of the plurality of process steps to produce a transfer function (block 813), for example, as described in blocks 240 of FIG. 2, block 750 of FIG. 7.

Referring to FIG. 8B, a method includes having a fabrication process for manufacturing a plurality of semiconductor wafers. The fabrication process comprises a plurality of process steps, where each of the plurality of process steps being associated with a set of process parameters. The method further includes performing a first process step from the plurality of process steps on a first semiconductor wafer (block 851), where the first process step has an associated first process parameter, the first process parameter having a first process parameter value when performing the first process step on the first semiconductor wafer. The method further includes obtaining first measurements from the first semiconductor wafer (block 852), the first measurements comprising first characteristic values of a first characteristic at a first plurality of spatial locations on the first semiconductor wafer. The method further includes generating a first process step fingerprint for the first process step from the first measurements (block 853), for example, as described in blocks 220-230 of FIG. 2, block 720 of FIG. 7. The method further includes performing the first process step and a second process step from the plurality of process steps on a second semiconductor wafer (block 854), where the second process step has an associated second process parameter. The second process parameter has a second process parameter value when performing the second process step on the second semiconductor wafer. The method further includes obtaining second measurements from the second semiconductor wafer (block 855), where the second measurements comprising second characteristic values of a second characteristic at a second plurality of spatial locations on the second semiconductor wafer. The method further includes generating a second process step fingerprint for the second process step from the second measurements (block 856), for example, as described in blocks 220-230 of FIG. 2, blocks 720 and 740 of FIG. 7. The method further includes correlating the first process step fingerprint to the second process step fingerprint to produce a transfer function between the first process step and the second process step (block 857), for example, as described in block 240 of FIG. 2, block 750 of FIG. 7.

Referring to FIG. 8C, the method further includes performing the first process step and the second process step on a plurality of third semiconductor wafers (block 861), for example, as described in block 250 of FIG. 2, block 740 of FIG. 7, where the first process parameter has the first process parameter value and the second process parameter having a plurality of second process parameter values when performing the first process step and the second process step on the plurality of third semiconductor wafers. The method further includes obtaining a plurality of third measurements from the plurality of third semiconductor wafers (block 862), where the plurality of third measurements comprising third characteristic values of the second characteristic at the second plurality of spatial locations on the plurality of third semiconductor wafers. The method further includes generating a plurality of second process step fingerprints for the second process step from the third measurements (block 863), for example, as described in block 250 of FIG. 2, block 740 of FIG. 7. The method further includes generating a process model for the second process step based on the plurality of second process step fingerprints and the transfer function (block 864), for example, as described in blocks 250-280 of FIG. 2, blocks 760-770 of FIG. 7, where the process model comprising a function of a second process parameter.

Figure 9:
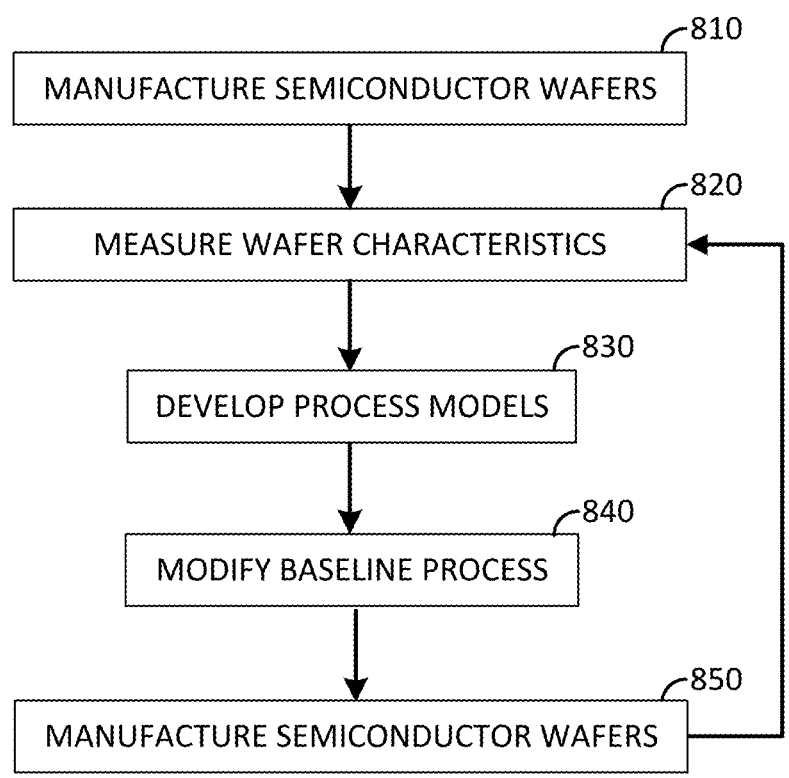
FIG. 9 is an illustrative flowchart implementing various embodiments to manufacture semiconductor wafers.

FIG. 9 is an illustrative flow chart implementing the process models developed in various embodiments of the present invention.

Referring to box 810, a plurality of semiconductor wafers is manufactured in a semiconductor fabrication facility. The plurality of semiconductor wafers may include multiple lots of wafers and may include variations in process parameters (baseline and non-baseline), as discussed above in various embodiments, that are subsequently used to develop the process step and layer fingerprints.

Referring next to box 820, wafer characteristics of the plurality of semiconductor wafers are measured, for example, as in-line measurements as discussed above in various embodiments.

As next illustrated in box 830, process models 830 are developed as discussed above in various embodiments, for example, in flow charts of FIGS. 2, 7, and 8A-8C.

By analyzing the process models 830, issues in the baseline process are identified (as previously described) and various process steps are modified for the baseline process. Consequently, wafers manufactured with the modified baseline process have improved process yield (box 840). In addition, advantageously because of the feedback loop, this process continuously provides feedback and the manufacturing line can be dynamically corrected, e.g., if there is a drift in production.

Embodiments of the invention may be used in ameliorating non-conforming regions. For example, in some implementations, the amelioration may include a selection of a pattern of a layer that includes some portion of a microelectronic device formed, at least in part, by the non-conforming region. Then, that selected pattern may be altered. The approach may be thus used to eliminate the non-conformities by employing a different design.

With this approach, a simulation of the fabrication of a semiconductor wafer is run with the altered pattern replacing the selected pattern. The effect on the electrical-mechanical properties and/or functionality of the microelectronic devices formed by the simulated semiconductor wafer is estimated. That estimate helps determine if the altered pattern changes the non-conforming regions in a manner that is desirable.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
obtaining wafer measurements of a characteristic of a semiconductor wafer at a plurality of process steps during a semiconductor wafer fabrication process, wherein at least one of the wafer measurements is associated with a spatial location on the semiconductor wafer from which the measurement is obtained;
creating a process step fingerprint from the obtained wafer measurements for each process step; and
correlating the process step fingerprint of one of the plurality of process steps to the process step fingerprint of another one of the plurality of process steps to produce a transfer function, the transfer function mapping the process step fingerprint of one of the plurality of process steps with the process step fingerprint of another one of the plurality of process steps.

2. The method of claim 1, wherein obtaining the wafer measurements comprises making the wafer measurements.

3. The method of claim 1, wherein creating the process step fingerprint comprises fitting a fingerprint model to the obtained wafer measurements for at least one of the plurality of process steps.

4. The method of claim 1, further comprising:
for each of the plurality of process steps, associating a process parameter from a plurality of process parameters, wherein at least one of the plurality of process parameters is associated with an adjustable condition of the fabrication process.

5. The method of claim 4, further comprising:
based on the transfer function, associating predictable characteristics of the process step fingerprint produced by the fabrication process with a particular process parameters for one of the process steps.

6. The method of claim 5, further comprising adjusting the particular process parameters to produce semiconductor wafers having associated predictable characteristics.

7. The method of claim 1, wherein the transfer function is a function that correlates to the process step fingerprints from a set of derived coefficients.

8. The method of claim 7, wherein the function includes one or more orthogonal functions selected from a Zernike polynomial, a Legendre polynomial, a Fourier series, and a Bessel function.

9. The method of claim 7, further comprising, based on the transfer function, associating coefficients of the function with a particular process parameter.

10. The method of claim 7, further comprising:
based on the transfer function, partitioning the process step fingerprint into two component vectors:
an immediate step vector that correlates a most recent one of the plurality of process steps; and
a transferred vector that is predictable from a processing history prior to the most recent one of the plurality of process steps.

11. A method comprising:
having a fabrication process for manufacturing a plurality of semiconductor wafers, the fabrication process comprising a plurality of process steps, at least one of the plurality of process steps being associated with a set of process parameters;
performing a first process step from the plurality of process steps on a first semiconductor wafer, the first process step having an associated first process parameter, the first process parameter having a first process parameter value when performing the first process step on the first semiconductor wafer;
obtaining first measurements from the first semiconductor wafer, the first measurements comprising first characteristic values of a first characteristic at a first plurality of spatial locations on the first semiconductor wafer;

generating a first process step fingerprint for the first process step from the first measurements;

performing the first process step and a second process step from the plurality of process steps on a second semiconductor wafer, the second process step having an associated second process parameter, the second process parameter having a second process parameter value when performing the second process step on the second semiconductor wafer;

obtaining second measurements from the second semiconductor wafer, the second measurements comprising second characteristic values of a second characteristic at a second plurality of spatial locations on the second semiconductor wafer;

generating a second process step fingerprint for the second process step from the second measurements; and correlating the first process step fingerprint to the second process step fingerprint to produce a transfer function between the first process step and the second process step.

12. The method of claim 11, further comprising:

performing the first process step and the second process step on a plurality of third semiconductor wafers, the first process parameter having the first process parameter value and the second process parameter having a plurality of second process parameter values when performing the first process step and the second process step on the plurality of third semiconductor wafers;

obtaining a plurality of third measurements from the plurality of third semiconductor wafers, the plurality of third measurements comprising third characteristic values of the second characteristic at the second plurality of spatial locations on the plurality of third semiconductor wafers; and generating a plurality of second process step fingerprints for the second process step from the third measurements; and generating a process model for the second process step based on the plurality of second process step fingerprints and the transfer function, the process model comprising a function of a second process parameter.

13. The method of claim 12, further comprising:
generating a process model for at least one of the plurality of process steps.

14. The method of claim 13, further comprising:
modifying a value for the second process parameter at the second process step; and fabricating a semiconductor wafer with the modified value for the second process parameter.

15. The method of claim 12, wherein at least one of the plurality of second process step fingerprints comprises a set of coefficient values associated with its respective one of the plurality of second process parameter values.

16. The method of claim 15, wherein generating the process model comprises:

dividing at least one of the set of coefficient values into an independent component value and a transferred component value by using the transfer function; and fitting the independent component value for at least one of the set of coefficient values with the plurality of second process parameter values to obtain the process model.

17. The method of claim 11, further comprising:
generating a process model for the first process step by generating a reduced first process step fingerprint.

18. The method of claim 11, wherein the transfer function comprises one or more orthogonal functions selected from a Zernike polynomial, a Legendre polynomial, a Fourier polynomial, and a Bessel function.

19. A non-transitory computer-readable storage medium comprising instructions that when executed cause a processor of a computing device to perform operations in coordination with a semiconductor wafer fabrication process, the semiconductor wafer fabrication process comprising a plurality of process steps, at least one of the plurality of process steps being associated with a set of process parameters, the operations comprising:

performing a first process step from a plurality of process steps on a first semiconductor wafer, the first process step having an associated first process parameter, the first process parameter having a first process parameter value when performing the first process step on the first semiconductor wafer;

obtaining first measurements from the first semiconductor wafer, the first measurements comprising first characteristic values of a first characteristic at a first plurality of spatial locations on the first semiconductor wafer;

generating a first process step fingerprint for the first process step from the first measurements;

performing the first process step and a second process step from the plurality of process steps on a second semiconductor wafer, the second process step having an associated second process parameter, the second process parameter having a second process parameter value when performing the second process step on the second semiconductor wafer;

obtaining second measurements from the second semiconductor wafer, the second measurements comprising second characteristic values of a second characteristic at a second plurality of spatial locations on the second semiconductor wafer;

generating a second process step fingerprint for the second process step from the second measurements; and correlating the first process step fingerprint to the second process step fingerprint to produce a transfer function between the first process step and the second process step.

20. The non-transitory computer-readable storage medium of claim 19, wherein the operations further comprise:

performing the first process step and the second process step on a plurality of third semiconductor wafers, the first process parameter having the first process parameter value and the second process parameter having a plurality of second process parameter values when performing the first process step and the second process step on the plurality of third semiconductor wafers;

obtaining a plurality of third measurements from the plurality of third semiconductor wafers, the plurality of third measurements comprising third characteristic values of the second characteristic at the second plurality of spatial locations on the plurality of third semiconductor wafers; and generating a plurality of second process step fingerprints for the second process step from the third measurements; and generating a process model for the second process step based on the plurality of second process step fingerprints and the transfer function, the process model comprising a function of a second process parameter.

21. The non-transitory computer-readable storage medium of claim 19, wherein the transfer function comprises one or more orthogonal functions selected from a Zernike polynomial, a Legendre polynomial, a Fourier polynomial, and a Bessel function.

* * * * *